United States Patent
Han et al.

(10) Patent No.: US 11,398,428 B2
(45) Date of Patent: Jul. 26, 2022

(54) MULTIFUNCTIONAL MOLECULES FOR SELECTIVE POLYMER FORMATION ON CONDUCTIVE SURFACES AND STRUCTURES RESULTING THEREFROM

(71) Applicant: Intel Corporation, Santa Clara, CA (US)

(72) Inventors: Eungnak Han, Portland, OR (US); Tayseer Mahdi, Hillsboro, OR (US); Rami Hourani, Portland, OR (US); Gurpreet Singh, Hillsboro, OR (US); Florian Gstrein, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/956,251

(22) PCT Filed: Mar. 26, 2018

(86) PCT No.: PCT/US2018/024364
§ 371 (c)(1),
(2) Date: Jun. 19, 2020

(87) PCT Pub. No.: WO2019/190463
PCT Pub. Date: Oct. 3, 2019

(65) Prior Publication Data
US 2021/0057337 A1    Feb. 25, 2021

(51) Int. Cl.
*H01L 23/522* (2006.01)
*G03F 7/20* (2006.01)
(Continued)

(52) U.S. Cl.
CPC ...... *H01L 23/5226* (2013.01); *G03F 7/70033* (2013.01); *H01L 21/76816* (2013.01);
(Continued)

(58) Field of Classification Search
CPC ... H01L 23/522; H01L 23/528; H01L 23/532; H01L 23/5226; H01L 21/768;
(Continued)

(56) References Cited

U.S. PATENT DOCUMENTS

| | | |
|---|---|---|
| 9,632,408 B1 | 4/2017 | Cottle |
| 2003/0207560 A1 | 11/2003 | Dubin |

(Continued)

FOREIGN PATENT DOCUMENTS

| | | |
|---|---|---|
| CN | 103187245 | 7/2013 |
| JP | 2004-253671 A | 9/2004 |

(Continued)

OTHER PUBLICATIONS

International Preliminary Report on Patentability for International Patent Application No. P120501PCT, dated Oct. 8, 2021, 10 pgs.

(Continued)

*Primary Examiner* — Chuong A Luu
(74) *Attorney, Agent, or Firm* — Schwabe, Williamson & Wyatt, P.C.

(57) ABSTRACT

Multifunctional molecules for selective polymer formation on conductive surfaces, and the resulting structures, are described. In an example, an integrated circuit structure includes a lower metallization layer including alternating metal lines and dielectric lines above the substrate. A molecular brush layer is on the metal lines of the lower metallization layer, the molecular brush layer including multifunctional molecules. A triblock copolymer layer is above the lower metallization layer. The triblock copolymer layer includes a first segregated block component over the dielectric lines of the lower metallization layer, and alternating second and third segregated block components on the (Continued)

molecular brush layer on the metal lines of the lower metallization layer, where the third segregated block component is photosensitive.

9 Claims, 16 Drawing Sheets

(51) Int. Cl.
*H01L 21/768* (2006.01)
*H01L 23/528* (2006.01)

(52) U.S. Cl.
CPC .. *H01L 21/76822* (2013.01); *H01L 21/76877* (2013.01); *H01L 21/76897* (2013.01); *H01L 23/528* (2013.01)

(58) Field of Classification Search
CPC ................. H01L 21/027; H01L 21/321; H01L 21/76816; H01L 21/76822; H01L 21/76877; H01L 21/76897; H01L 21/0271; H01L 21/76883; H01L 21/76834; H01L 21/0274; H01L 29/78; H01L 29/7848; H01L 27/088; H01L 27/0886; H01L 23/5329; H01L 23/53238; H01L 21/76807
USPC ........................................................ 257/774
See application file for complete search history.

(56) References Cited

U.S. PATENT DOCUMENTS

| | | |
|---|---|---|
| 2009/0206054 A1 | 8/2009 | Nealey et al. |
| 2013/0230981 A1* | 9/2013 | Kawamura ....... H01L 21/76897 |
| | | 438/637 |
| 2014/0273511 A1 | 9/2014 | Farrell |
| 2016/0351449 A1 | 12/2016 | Bristol et al. |
| 2017/0058401 A1 | 3/2017 | Blackwell et al. |
| 2018/0323104 A1* | 11/2018 | Younkin ............. H01L 21/0274 |
| 2020/0066629 A1* | 2/2020 | Schenker .......... H01L 21/76801 |

FOREIGN PATENT DOCUMENTS

| | | |
|---|---|---|
| JP | 2013-065392 A | 4/2013 |
| KR | 10-2014-0081249 | 7/2014 |
| WO | WO 2014/061760 | 4/2014 |
| WO | WO 2014/184114 | 11/2014 |
| WO | WO 2015/091047 | 6/2015 |
| WO | WO-2017-111926 | 6/2017 |

OTHER PUBLICATIONS

International Search Report and Written Opinion for International Patent Application No. PCT/US2018/024364 dated Dec. 17, 2018, 13 pgs.
Office Action from Japanese Patent Application No. P120501PCT-JP, dated Dec. 14, 2021, 7 pgs.

* cited by examiner

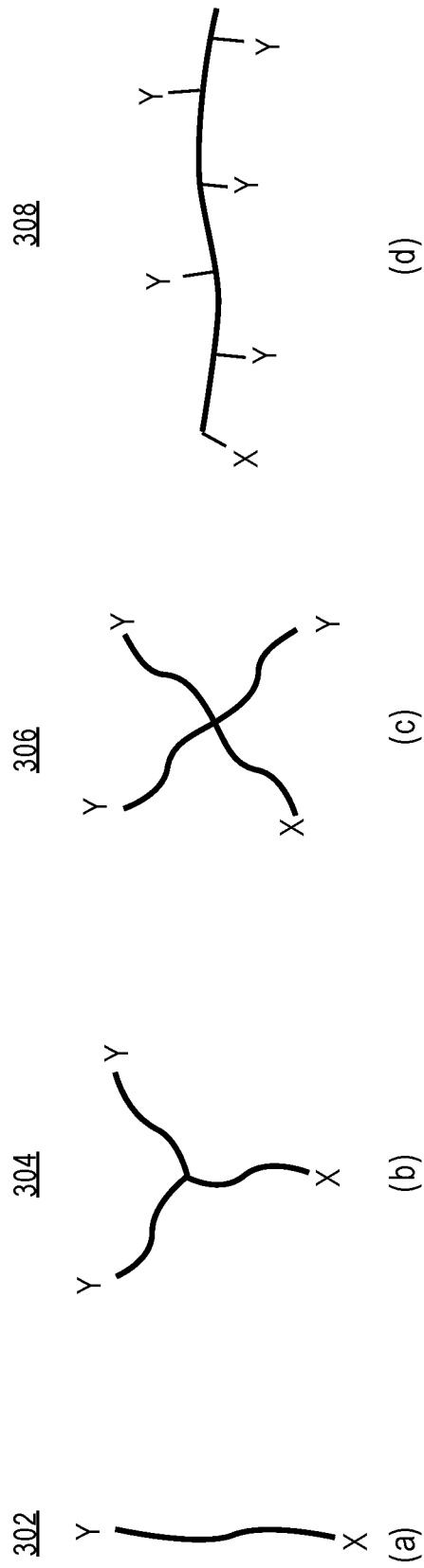
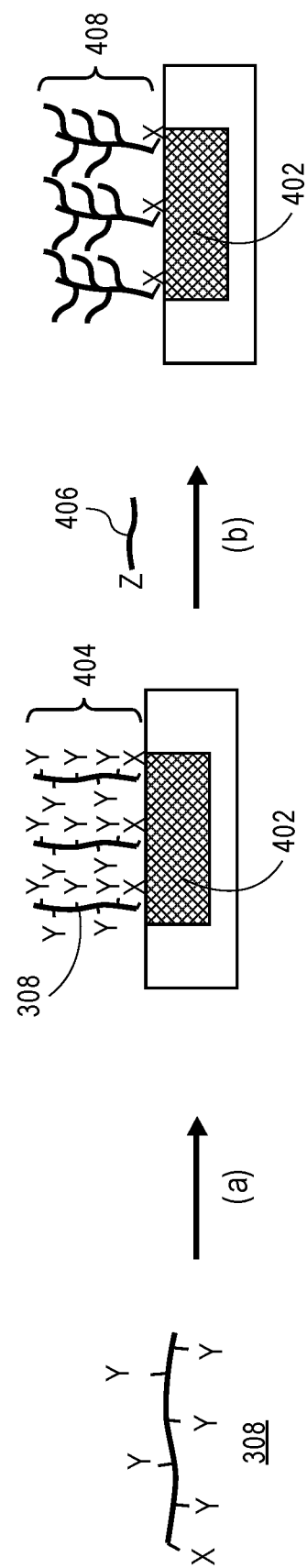
FIG. 3
FIG. 4A

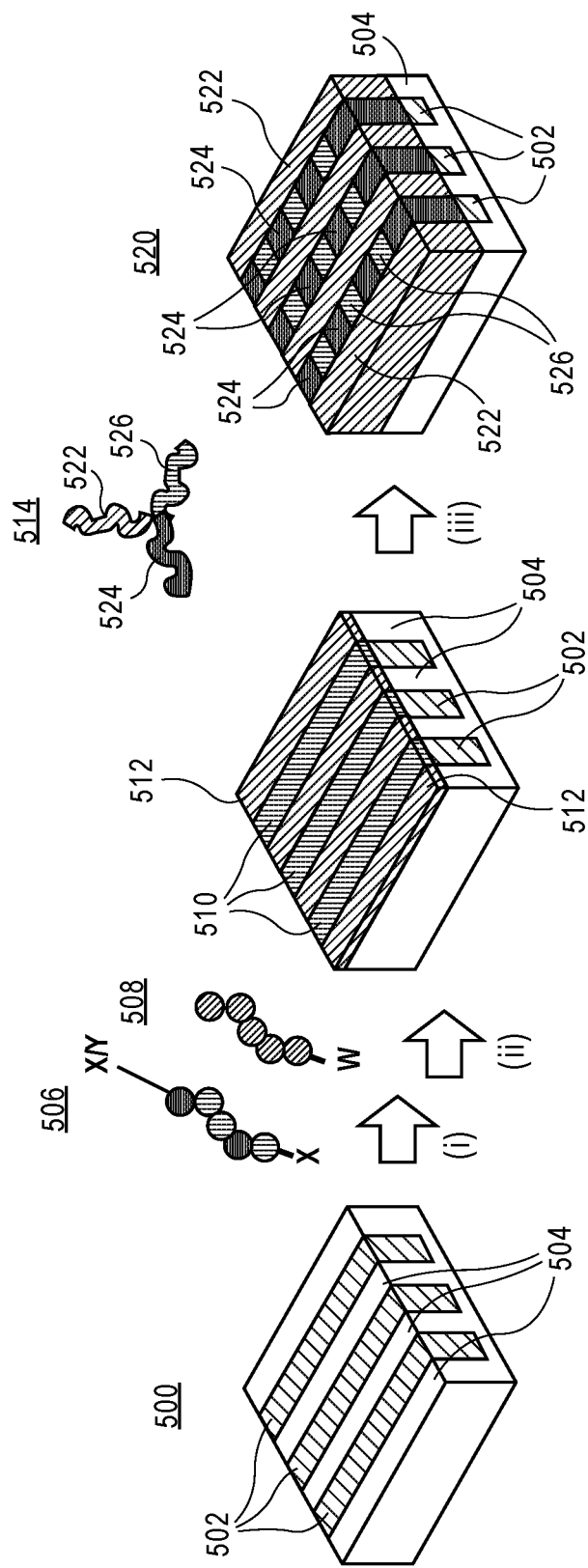

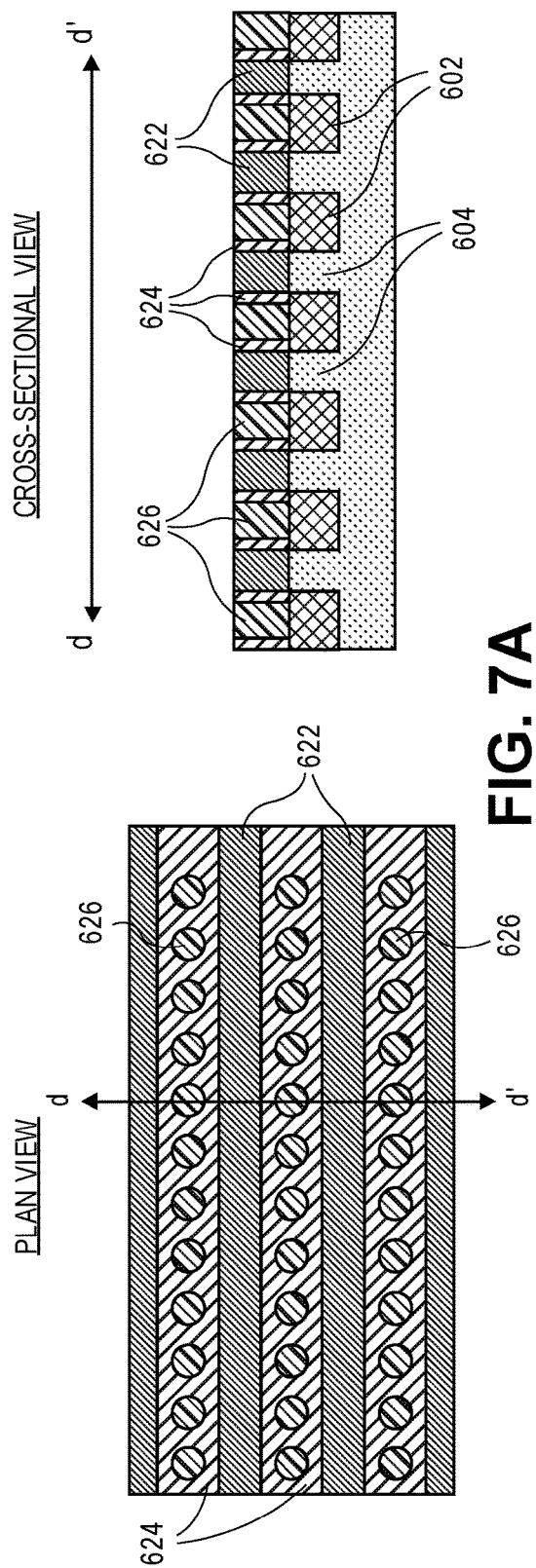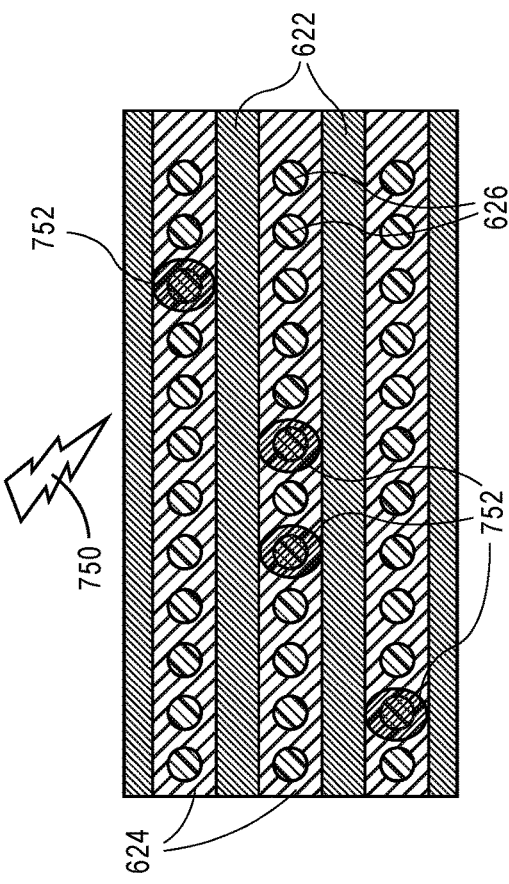
FIG. 7A
FIG. 7B

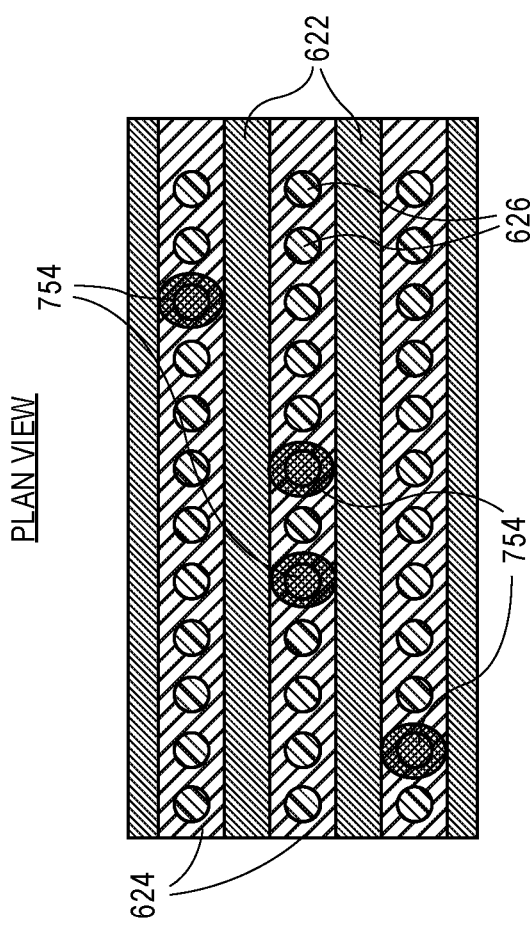
FIG. 7C
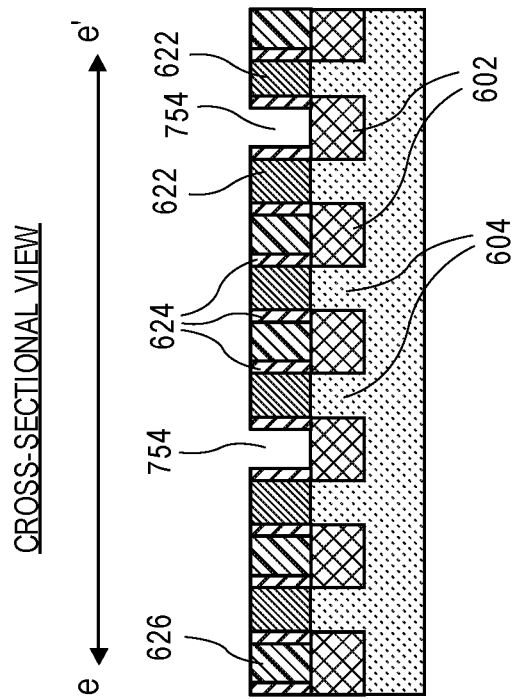
FIG. 7D
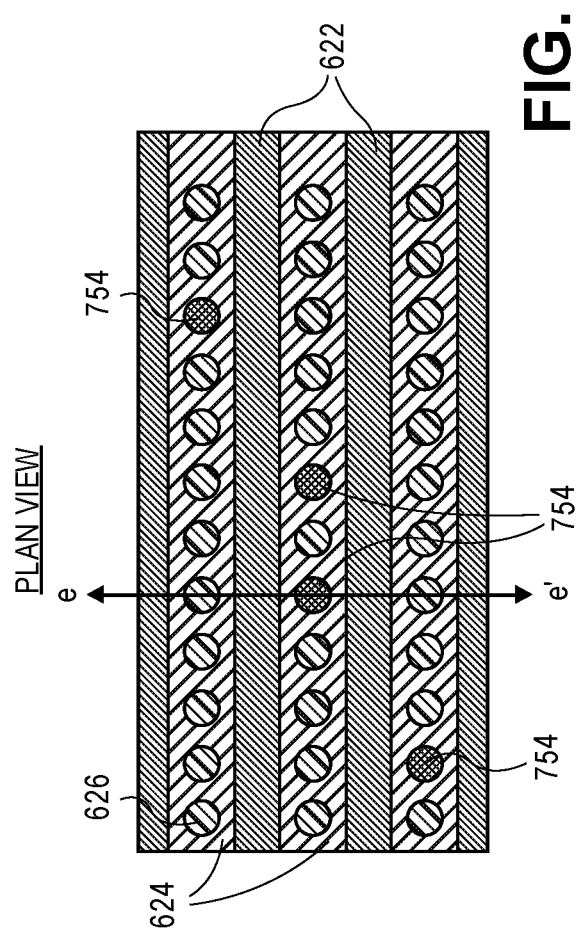

MULTIFUNCTIONAL MOLECULES FOR SELECTIVE POLYMER FORMATION ON CONDUCTIVE SURFACES AND STRUCTURES RESULTING THEREFROM

CROSS-REFERENCE TO RELATED APPLICATION

This patent application is a U.S. National Phase Application under 35 U.S.C. § 371 of International Application No. PCT/US2018/024364, filed Mar. 26, 2018, entitled "MULTIFUNCTIONAL MOLECULES FOR SELECTIVE POLYMER FORMATION ON CONDUCTIVE SURFACES AND STRUCTURES RESULTING THEREFROM," which designates the United States of America, the entire disclosure of which is hereby incorporated by reference in its entirety and for all purposes.

TECHNICAL FIELD

Embodiments of the disclosure are in the field of semiconductor structures and processing and, in particular, multifunctional molecules for selective polymer formation on conductive surfaces, and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the art as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70-90 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly several different lithographic masks may be used, which tend to increase the costs. At some point, if pitches continue to decrease, it may not be possible, even with multiple masks, to print via openings for these extremely small pitches using EUV scanners.

Thus, improvements are needed in the area of back end metallization manufacturing technologies for fabricating metal vias.

BRIEF DESCRIPTION OF THE DRAWINGS

FIG. 3 includes schematic illustrations of hetero-multifunctional molecules with (a) a multifunctional molecule having one functional site (X) and one functional site (Y), (b) a multifunctional molecule having one functional site (X) and two functional sites (Y), (c) a multifunctional molecule having two functional sites (X) and two functional sites (Y), and a multifunctional molecule having one functional site (X) and four or more functional sites (Y), in accordance with an embodiment of the present disclosure.

FIG. 4A is a schematic illustrating chain extension/densification by a coupling reaction with a multifunctional molecule of FIG. 3, in accordance with an embodiment of the present disclosure.

FIGS. 5A-5C illustrate angled cross-sectional views representing various operations in a method using a multifunctional molecule brush layer followed by triblock copolymers for forming self-aligning vias or contacts for back end of line (BEOL) interconnects, in accordance with an embodiment of the present disclosure.

FIGS. 7A-7D illustrate plan views and corresponding cross-sectional views representing various operations in a method using a multifunctional molecule brush layer followed by a triblock copolymer for forming self-aligning vias or contacts for back end of line (BEOL) interconnects, in accordance with an embodiment of the present disclosure.

DESCRIPTION OF THE EMBODIMENTS

Figure 1:
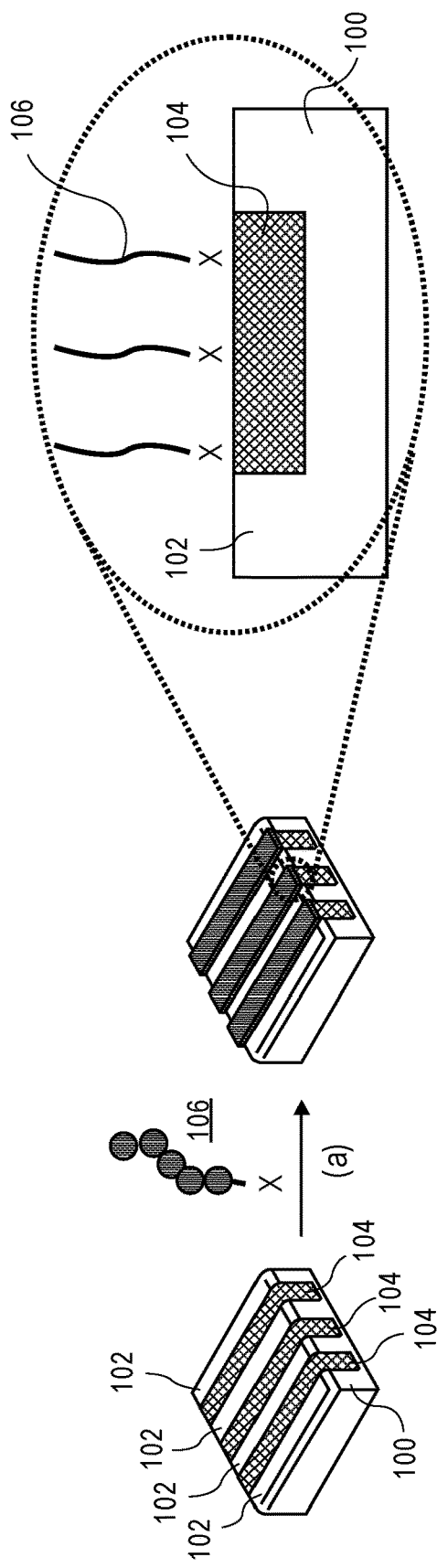
FIG. 1 is a representative schematic of previous approaches for forming a polymeric material or layer on a metal surface.

Multifunctional molecules for selective polymer formation on conductive surfaces, and the resulting structures, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to multifunctional molecules for selective polymer grafting and/or deposition and densification for directed self-assembly (DSA) and/or selective growth processes. Embodiments may include or be directed to one or more of directed self-assembly, selective growth, or selective surface modification. One or more embodiments are directed to polymeric materials that are selectively deposited on a metal or metallic surface (or, alternatively, dielectric surface) and serve as (1) a guiding pattern for directed self-assembly of a block co-polymer (BCP) and/or (2) a blocking (or seed, or template) layer for selective growth/deposition/infiltration of a dielectric (or metal/metallic surface).

To provide context, uniform and dense coverage of a polymeric layer on a metal surface (or, more generally, a metallic surface which includes a metal and is conductive), or alternatively a dielectric surface, is critical for both DSA and selective growth/deposition/infiltration processes. Embodiments described herein provide methodologies and material designs to improve polymer density by utilizing multifunctional molecules. In an embodiment, multifunctional molecules are used to cover a metallic surface. A first functional group (functional group #1) is used to achieve site-specific deposition/grafting. A second functional group (functional group #2) is used to achieve coupling (or cross-linking) reactions to densify a polymer layer after initial selective deposition/grafting. In an embodiment, selective surface modification with high polymer density (or surface coverage) enables defect reduction in DSA and selective deposition processes.

To provide an illustrative comparative example, FIG. 1 is a representative schematic of previous approaches for forming a polymeric material or layer on a metal surface. Referring to FIG. 1, a substrate 100 includes alternating inter-layer dielectric (ILD) regions 102 and conductive regions 104. At operation (a), substrate 100 is treated with a polymeric material 106, such as polystyrene (PS). The polymeric material 106 is selectively deposited/drafted onto the surface of the conductive region 104 with little to no bonding onto the ILD regions 102. However, since polymeric material 106 has only a single functional group (X) for selective deposition/grafting, sufficient surface coverage of the polymeric material 106 on the surface of the conductive region 104 for a particular application may not be achieved.

In contrast to the process described in association with FIG. 1, in accordance with an embodiment of the present disclosure, use of a multifunctional molecule can improve surface coverage and density, versus a situation where a site-specific polymer deposition (or grafting) based on end functionalized polymer (e.g., having single functional group at the one of the polymer chain end, as illustrated in FIG. 1)

may not provide enough surface coverage for a desired application. Thus, approaches based on multifunctional molecules may improve surface coverage and density for effective DSA and selective deposition processes.

Figure 2:
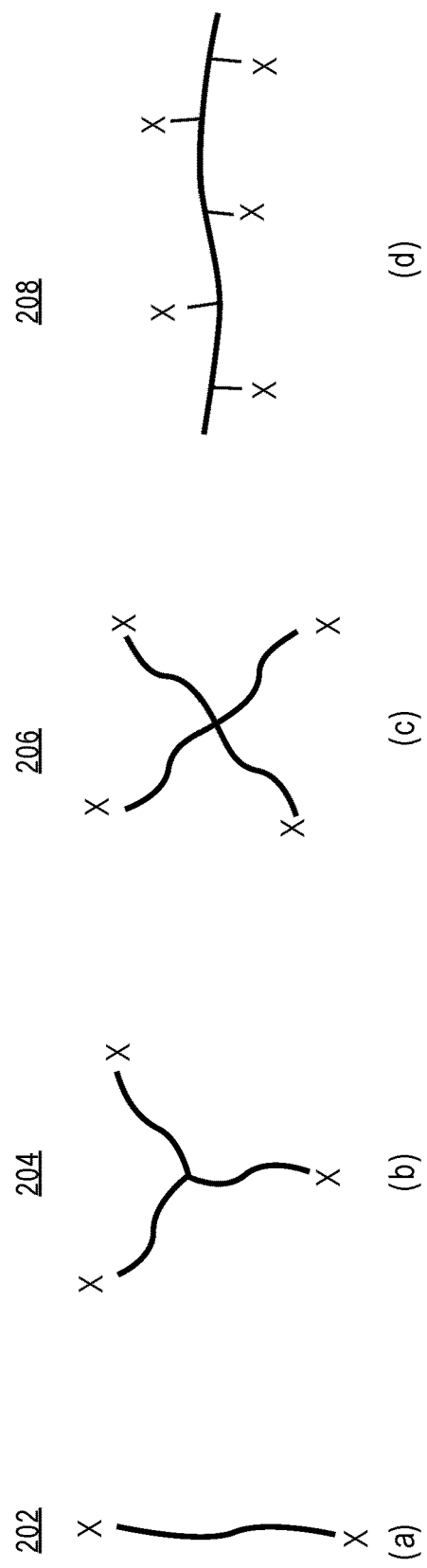
FIG. 2 includes schematic illustrations of multifunctional molecules with (a) a multifunctional molecule having two functional sites (X), (b) a multifunctional molecule having three functional sites (X), (c) a multifunctional molecule having four functional sites (X), and a multifunctional molecule having five or more functional sites (X), in accordance with an embodiment of the present disclosure.

In a first aspect, FIG. 2 includes schematic illustrations of multifunctional molecules with (a) a multifunctional molecule 202 having two functional sites (X), (b) a multifunctional molecule 204 having three functional sites (X), (c) a multifunctional molecule 206 having four functional sites (X), and a multifunctional molecule 208 having five or more functional sites (X), in accordance with an embodiment of the present disclosure.

The multifunctional molecules of FIG. 2 increase the number of metal surface selective functional groups X per molecule to increase grafting/deposition efficiency. In an embodiment, examples of X include a thiol, a disulfide, a phosphonic acid, a phosphonate, a hydroxyl, a nitrile, a carboxylic acid, a 2-vinyl pyridine, or a 4-vinyl pyridine group.

In another aspect, FIG. 3 includes schematic illustrations of hetero-multifunctional molecules with (a) a multifunctional molecule 302 having one functional site (X) and one functional site (Y), (b) a multifunctional molecule 304 having one functional site (X) and two functional sites (Y), (c) a multifunctional molecule 306 having two functional sites (X) and two functional sites (Y), and a multifunctional molecule 308 having one functional site (X) and four or more functional sites (Y), in accordance with an embodiment of the present disclosure. The multifunctional molecules of FIG. 3 include a second different functional group Y which may be introduced to enable a coupling reaction with a functional group Z after initial selective grafting/deposition.

FIG. 4A is a schematic illustrating chain extension/densification by a coupling reaction with multifunctional molecules 306 of FIG. 3, in accordance with an embodiment of the present disclosure.

Referring to FIG. 4A, at operation (a) multifunctional molecules 306 is selectively grafted or deposited onto a metallic surface 402 to form a covered surface 404. The covered surface 404 may be referred to as having relatively low surface coverage. At operation (b), the covered surface 404 is treated with a second polymeric material 406, such as a single functional polymeric material as shown, to cause a coupling reaction between functional groups Y and Z to form a second covered surface 408. The second covered surface 408 may be referred to as having relatively high surface coverage.

In an embodiment, examples of Y and Z combinations that can undergo coupling (or cross linking) reaction include a thiol and an alkyne, a thiol and an alkene, an alkyne and an azide, a thiol and a different thiol, a thiol and a disulfide, a carboxylic group and an amine group (e.g., where coupling is by EDC/NHS activation), or an anthracene and a maleimide.

It is to be appreciated that a coupling reaction between Y and Z can be repeated multiple times to increase polymer density further by layer by layer deposition. As an example, FIG. 4B is a schematic illustrating chain extension/densification by multiple coupling reactions with multifunctional molecules, in accordance with an embodiment of the present disclosure.

Figure 4B:
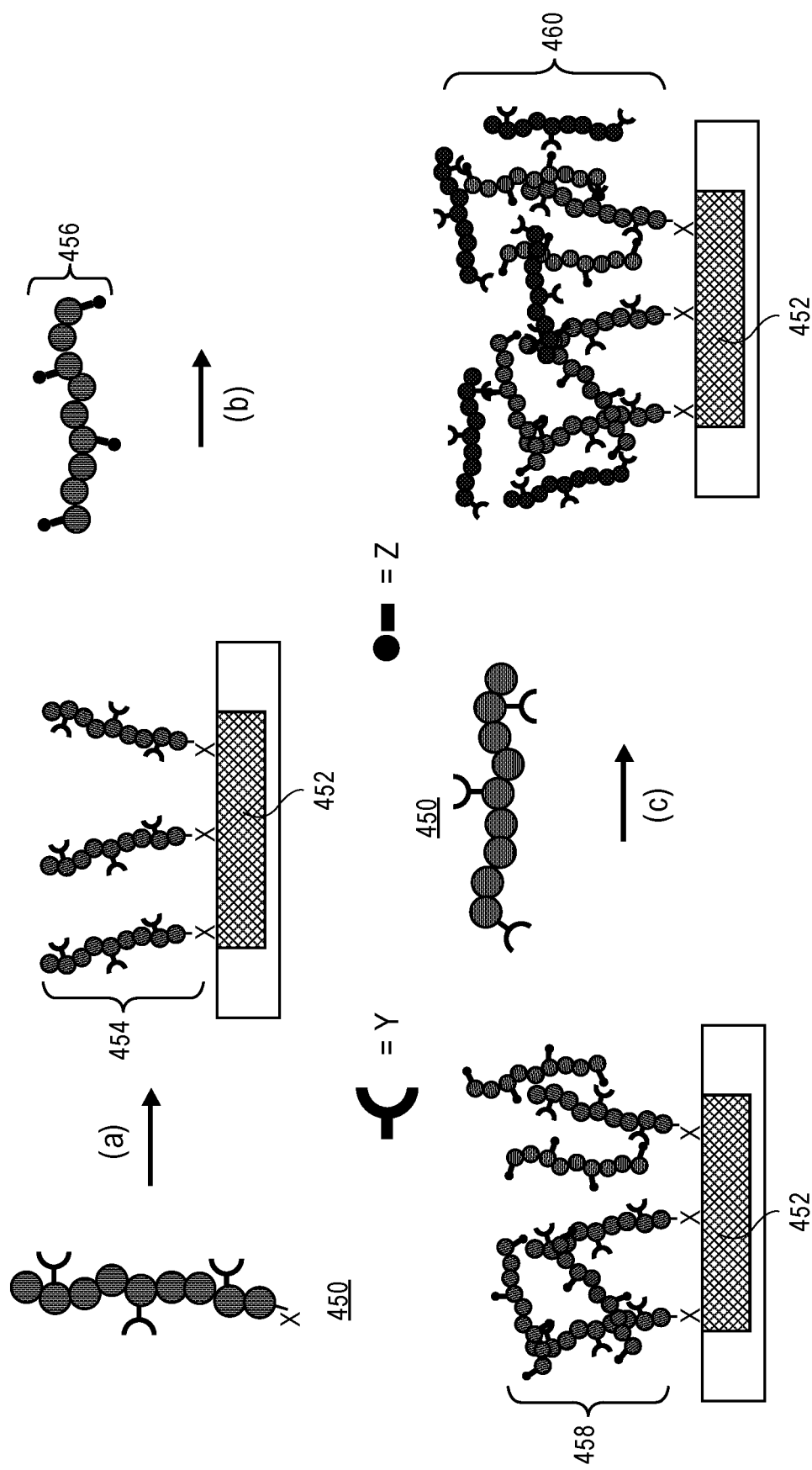
FIG. 4B is a schematic illustrating chain extension/densification by multiple coupling reactions with multifunctional molecules, in accordance with an embodiment of the present disclosure.

Referring to FIG. 4B, at operation (a), first multifunctional molecules 450 are selectively grafted or deposited onto a metallic surface 452 to form a covered surface 454. The covered surface 454 may be referred to as having relatively low surface coverage. At operation (b), the covered surface 454 is treated with a second material 456 to cause a coupling reaction between functional groups Y and Z to form a second covered surface 458. The second covered surface 408 may be referred to as having relatively higher surface coverage. At operation (c) the second covered surface 458 is treated again with the first polymeric material 450 (or like material) to cause a coupling reaction between functional groups Z and Y to form a third covered surface 460. The third covered surface 460 may be referred to as having relatively high surface coverage.

In another aspect, one or more embodiments described herein are directed to the use of a multifunctional molecule brush layer together with a multi triblock copolymer for self-aligning vias or contacts. Through the use of more advanced block copolymers and a directed self-assembly strategy, alignment to an underlying tight metal layer can be achieved. Since a triblock copolymer material has three phases, it can be effected to phase separate into "self-aligned photobuckets." Embodiments described herein may be implemented to improve cost, scalability, pattern placement error, and variability. In an embodiment, the use of a self-aligning triblock copolymer to generate aligned photobuckets is described. One or more embodiments described herein offer a more efficient approach to patterning by maximizing the overlay process window, minimizing the size and shape of required patterns, and increasing the efficiency of the lithography process to pattern holes (e.g., vias or contacts) or plugs.

FIGS. 5A-5C illustrate angled cross-sectional views representing various operations in a method using a multifunctional molecule brush layer followed by triblock copolymers for forming self-aligning vias or contacts for back end of line (BEOL) interconnects, in accordance with an embodiment of the present disclosure.

Referring to FIG. 5A, a semiconductor structure layer 500 has a grating pattern of alternating metal lines 502 and interlayer dielectric (ILD) lines 504. The structure 500 may be treated with a first molecular brush operation (i) with first molecular species 506. In an embodiment, first molecular species 506 is a multifunctional molecule, examples of which are described in association with FIGS. 2, 3, 4A and 4B. In the example, shown, first molecular species 506 includes two (X) functionalities or one (X) and one (Y) functionality. In an embodiment, first molecular species 506 is used to form a brush layer 510 on metal lines 502.

The structure 500 may also be treated with a second molecular brush operations (ii) with second molecular species 508 to form a brush layer 512 on the ILD lines 504. In an embodiment, the second molecular species 508 is a single functional polymer group having a single (W) functionality. It is to be appreciated that the order of operations (i) and (ii) may be reversed, or may even be performed at substantially the same time.

Referring to FIG. 5B, the molecular brush operations may be performed to alter or provide a derivative surface for the alternating metal lines 502 and ILD lines 504. For example, the surface of metal lines 502 may be treated to have a brush layer 510 having an A/B surface on metal lines 502. The surface of ILD lines 504 may be treated to have a brush layer 512 having a C surface on ILD lines 504.

Referring to FIG. 5C, the structure of FIG. 5B is exposed to a treatment operation (iii) which involves application of a triblock block copolymer (triblock BCP) 514, and possible subsequent segregating treatment, to form a segregated structure 520. Segregated structure 520 includes first regions 522 of a segregated triblock BCP above the ILD lines 504. Alternating second regions 524 and third regions 526 of the segregated triblock BCP are above the metal lines 502. The ultimate arrangement of the three blocks of the triblock copolymer 514 is based on chemo-epitaxy since only an underlying pattern (and not a co-planar pattern, as is used in grapho-epitaxy) is used to direct the assembly of the triblock copolymer 514 to form the segregated structure 520.

Referring again to FIG. 5C, in an embodiment, the brush layers 510 and 512 are consumed or degraded during, and essentially no longer remain subsequent to, the application or subsequent treatment of triblock block copolymer (triblock BCP) 514, as is depicted in FIG. 5C. In another embodiment only brush layer 510 is consumed or degraded during, and essentially no longer remain subsequent to, the application or subsequent treatment of triblock block copolymer (triblock BCP) 514, while brush layer 512 is retained in essentially its initial form. In another embodiment only brush layer 512 is consumed or degraded during, and essentially no longer remain subsequent to, the application or subsequent treatment of triblock block copolymer (triblock BCP) 514, while brush layer 510 is retained in essentially its initial form. In another embodiment both brush layer 510 and brush layer 512 are retained in essentially their initial form after forming and segregating (triblock BCP) 514.

In an embodiment, the third segregated block 526 component of the triblock copolymer layer 514 is photosensitive. In an embodiment, the triblock copolymer layer 514 is formed to a thickness approximately in the range of 5-100 nanometers. In an embodiment, the triblock copolymer layer 514 includes a triblock copolymer species selected from the group consisting of any three of poly-styrene and other polyvinylarenes, polyisoprene and other polyolefins, polymethacrylate and other poly-esters, polydimethylsiloxane (PDMS) and related Si-based polymers, polyferrocenylsilanes, polyethyelene oxide (PEO) and related poly-ethers and poly-vinylpyridine. In one embodiment, the alternating second 524 and third 526 segregated block components have a ratio of approximately 1:1, as is depicted in FIG. 5C (and as is described below in association with FIG. 6B). In another embodiment, the alternating second 624 and third 626 segregated block components have a ratio of X:1, second segregated block component 624 to third segregated block component 626, where X is greater than 1, and where the third segregated block component 626 has a columnar structure surrounded by the second segregated block component, as is described below in association with FIG. 7A. In another embodiment, the triblock copolymer layer 514 is a blend of homopolymers of A, B, and/or C or diblock BCPs of the A-B, B-C, or A-C components in order to achieve the desired morphology.

In an embodiment, all portions of the third segregated block component 526 of the structure 520 of FIG. 5C are then removed. In one such embodiment, the removal of all portions of the third segregated block component 526 opens all possible via locations that may be formed above the underlying metallization later. The openings may be filled with a photoresist layer to ultimately allow for selection of only those via locations need for a particular design. In another embodiment, only select portions of the third segregated block component 526 of the structure 520 of FIG. 5C are removed. In one such embodiment, the removal of only select portions of the third segregated block component 526 reveals only those via locations above the underlying metallization layer needed for a particular design.

It is to be appreciated that, typically, the blocks of triblock copolymers may each have different chemical properties. As one example, one of the blocks may be relatively more hydrophobic (e.g., water repelling) while the two blocks may be relatively more hydrophilic (water attracting), or vice versa. At least conceptually, one of the blocks may be relatively more similar to oil and the other two blocks may be relatively more similar to water, or vice versa. Such differences in chemical properties between the different blocks of polymers, whether a hydrophilic-hydrophobic difference or otherwise, may cause the block copolymer molecules to self-assemble. For example, the self-assembly may be based on microphase separation of the polymer blocks. Conceptually, this may be similar to the phase separation of oil and water which are generally immiscible.

Similarly, differences in hydrophilicity between the polymer blocks may cause a roughly analogous microphase separation where the different polymer blocks try to "separate" from each other due to chemical dislike for one another. However, in an embodiment, since the polymer blocks are covalently bonded to one another, they cannot completely separate on a macroscopic scale. Rather, polymer blocks of a given type may tend to segregate or conglomerate with polymer blocks of the same type of other molecules in extremely small (e.g., nano-sized) regions or phases. The particular size and shape of the regions or microphases generally depends at least in part upon the relative lengths of the polymer blocks. In an embodiment, by way of example, FIGS. 5C, 6B and 7A depict possible assembly schemes for a triblock copolymer.

One or more embodiments described herein are directed to an approach that employs an underlying metal as a template to build the conductive vias. It is to be appreciated that similar approaches may be implemented to fabricate non-conductive spaces or interruptions between metals (referred to as "plugs"). Vias, by definition, are used to land on a previous layer metal pattern. In this vein, embodiments described herein enable a more robust interconnect fabrication scheme since alignment by lithography equipment is no longer relied on. Such an interconnect fabrication scheme can be used to save numerous alignment/exposures, can be used to improve electrical contact (e.g., by reducing via resistance), and can be used to reduce total process operations and processing time otherwise required for patterning such features using conventional approaches. One or more embodiment described herein involves the pre-forming of every possible via opening location. An additional selection operation is then used to select which of the vias to retain. Such operations are illustrated herein using "photobuckets," although the selection process may also be performed using a more conventional resist expose and ILD backfill approach.

It is to be appreciated that a pattern needed to open a pre-formed via or plug location can be made to be relatively small, enabling an increase in the overlay margin of a lithographic process. The pattern features can be made of uniform size, which can reduce scan time on direct write ebeam and/or optical proximity correction (OPC) complexity with optical lithography. The pattern features can also be made to be shallow, which can improve the patterning resolution. A subsequently performed etch process may be an isotropic chemically selective etch. Such an etch process mitigates otherwise associated with profile and critical dimension and mitigates anisotropic issues typically associated with dry etch approaches. Such an etch process is also relatively much less expensive from an equipment and throughput perspective as compared to other selective removal approaches.

In an exemplary embodiment, as mentioned briefly above, approaches described herein build on the use of so-called "photobuckets," in which every possible feature, e.g. via or plug, is re-patterned into a substrate. Then, a photoresist is filled into patterned features and the lithography operation is merely used to choose select vias for via opening formation. The photobucket approach allows for larger critical dimensions (CD)s and/or errors in overlay while retaining the ability to choose the via or plug of interest. Lithographic approaches for selecting particular photobuckets may include, but may not be limited to, 193 nm immersion lithography (i193), extreme ultra-violet (EUV) and/or e-beam direct write (EBDW) lithography. It is also to be appreciated that embodiments are not limited to the concept of photobuckets, but have far reaching applications to structures having pre-formed features fabricated using bottom-up and/or directed self-assembly (DSA) approached.

The following describes portions of integrated circuit layers representing various operations in a method of self-aligned via and metal patterning. In particular, FIGS. 6A and 6B illustrate plan views and corresponding cross-sectional views representing various operations in a method using a multifunctional molecule brush layer followed by a triblock copolymer for forming self-aligning vias or contacts for back end of line (BEOL) interconnects, in accordance with an embodiment of the present disclosure.

Figure 6A:
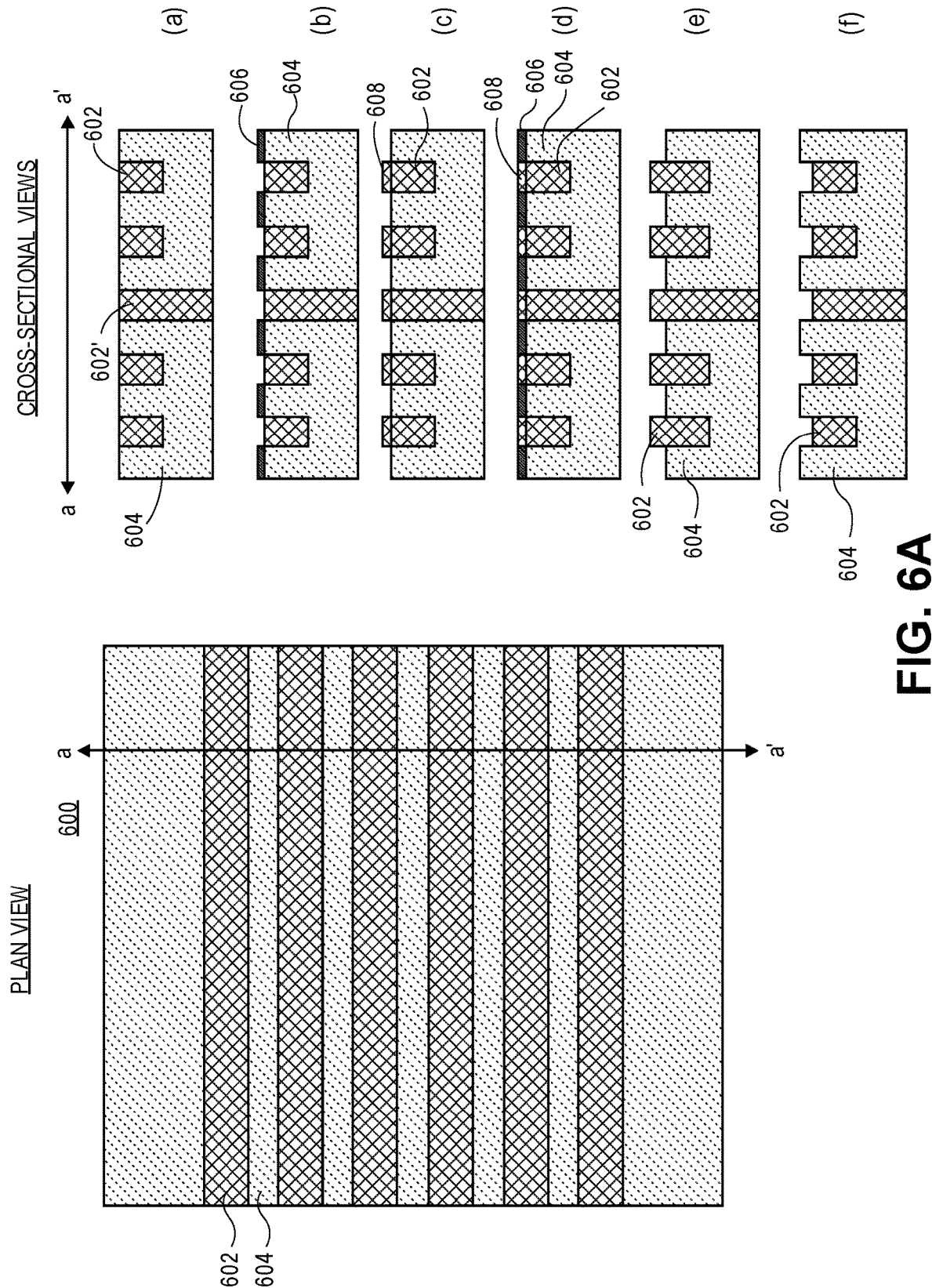
FIGS. 6A and 6B illustrate plan views and corresponding cross-sectional views representing various operations in a method using a multifunctional molecule brush layer followed by a triblock copolymer for forming self-aligning vias or contacts for back end of line (BEOL) interconnects, in accordance with an embodiment of the present disclosure.
Figure 6B:
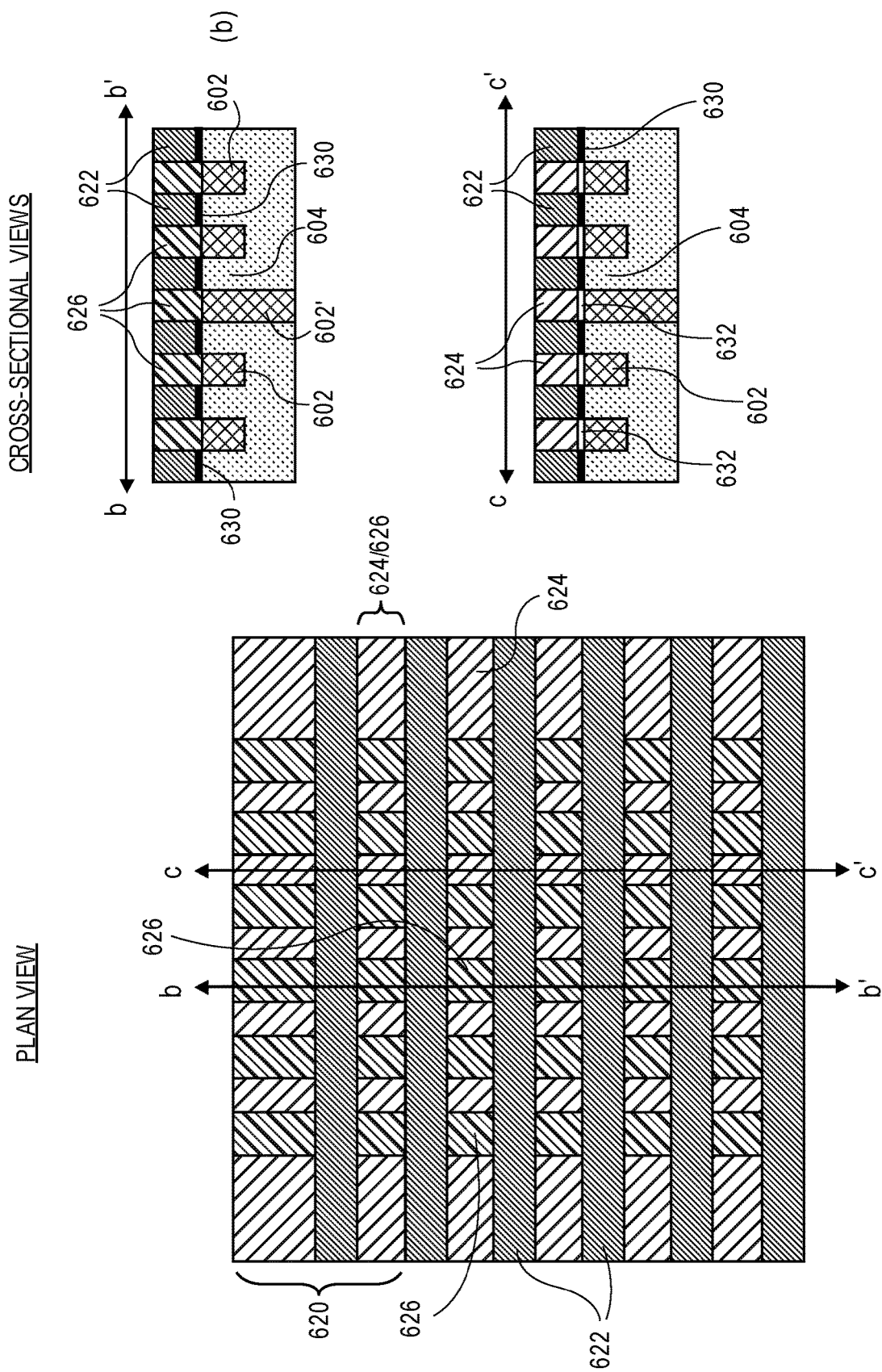

FIG. 6A illustrates a plan view and corresponding cross-sectional views taken along the a-a' axis of options for a previous layer metallization structure, in accordance with an embodiment of the present disclosure. Referring to the plan view and corresponding cross-section view option (a), a starting structure 600 includes a pattern of metal lines 602 and interlayer dielectric (ILD) lines 604. The starting structure 600 may be patterned in a grating-like pattern with metal lines spaced at a constant pitch and having a constant width, as is depicted in FIG. 6A in the case that self-assembling materials are ultimately formed thereon. In the case of cross-sectional view (a), the pattern of metal lines 602 and interlayer dielectric (ILD) lines 604 are planar with one another. Some of the lines may be associated with underlying vias, such as line 602' shown as an example in the cross-sectional views.

Referring again to FIG. 6A, alternative options (b)-(f) address situations where an additional film is formed (e.g., deposited, grown, or left as an artifact remaining from a previous patterning process) on a surface of one of, or both of, the metal lines 602 and interlayer dielectric lines 604. In example (b), an additional film 606 is on the interlayer dielectric lines 604. In example, (c), an additional film 508 is on the metal lines 602. In example, (d) an additional film 606 is on the interlayer dielectric lines 604, and an additional film 608 is on the metal lines 602. Furthermore, although the metal lines 602 and the interlayer dielectric lines 604 are depicted as co-planar in (a), in other embodiments, they are not co-planar. For example, in (e), the metal lines 602 protrude above the interlayer dielectric lines 604. In example, (f), the metal lines 602 are recessed below the interlayer dielectric lines 604.

Referring again to examples (b)-(d), an additional layer (e.g., layer 606 or 608) can be used as a hardmask (HM) or protection layer or be used to enable self-assembly described below in association with subsequent processing operations. Such additional layers may also be used to protect the ILD lines from further processing. In addition, selectively depositing another material over the metal lines may be beneficial for similar reasons. Referring again to examples (e) and (f), it may also be possible to recess either the ILD lines or the metal lines with any combination of protective/HM materials on either or both surfaces. Overall, there exist numerous options at this stage for preparing ultimately underlying surfaces for a directed self-assembly process.

In an embodiment, as used throughout the present description, interlayer dielectric (ILD) material, such as the material of the interlayer dielectric lines 604, is composed of or includes a layer of a dielectric or insulating material. Examples of suitable dielectric materials include, but are not limited to, oxides of silicon (e.g., silicon dioxide (Sift)), doped oxides of silicon, fluorinated oxides of silicon, carbon doped oxides of silicon, various low-k dielectric materials known in the art, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material, such as the material of metal lines 602, is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect. As will be described further below, top surfaces of the lower interconnect lines may be used for self-aligned via and plug formation.

In an embodiment, as is also used throughout the present description, hardmask materials, such, as layers 606 or 608 if included as a hardmask, are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

It is to be appreciated that the layers and materials described in association with FIG. 6A are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 5A may be fabricated on underlying lower level interconnect layers.

As described above, patterned features may be patterned in a grating-like pattern with lines, holes or trenches spaced at a constant pitch and having a constant width. The pattern, for example, may be fabricated by a pitch halving or pitch quartering approach. In an example, a blanket film is patterned using lithography and etch processing which may involve, e.g., spacer-based-quadruple-patterning (SBQP) or pitch quartering. It is to be appreciated that a grating pattern of lines can be fabricated by numerous methods, including 193 nm immersion litho (i193), EUV and/or EBDW lithography, directed self-assembly, etc.

Referring to FIG. 6B, brush layers are formed and then a triblock copolymer layer 620 is formed on the structure of FIG. 6A (e.g., plan view and cross-sectional structure (a)). The triblock copolymer layer 620 is segregated to have regions 622 formed above the ILD lines 604, and to have alternating second regions 624 and third regions 626 formed above metal lines 602.

Referring to the cross-sectional view along the b-b' axis of FIG. 6B, the third regions 626 are shown above the metal lines 602, and the first regions 622 are shown above the ILD lines 604. In accordance with one embodiment, also shown between first regions 622 and ILD lines 604 is layer 630 which may be a remnant of a molecular brush layer. However, it is to be appreciated that layer 630 may not be present following post treatments of triblock copolymer layer 620. In accordance with one embodiment, third regions 626 are shown as formed directly on metal lines 602. However, it is to be appreciated that remnants of a multifunctional molecular brush layer may be between the third regions 626 and the metal lines 602.

Referring to the cross-sectional view along the c-c' axis of FIG. 6B, the second regions 624 are shown above the metal lines 602, and the first regions 622 are shown above the ILD lines 604. In accordance with one embodiment, also shown between first regions 622 and ILD lines 604 is layer 630 which may be a remnant of a molecular brush layer. However, it is to be appreciated that layer 630 may no longer be present at this stage. In accordance with one embodiment, also shown between second regions 624 and metal lines 602 is layer 632 which may be a remnant of a multifunctional molecular brush layer. However, it is to be appreciated that layer 632 may no longer be present at this stage. It is also to be appreciated that regions 626 may be formed as photosensitive or may be replaced by a photosensitive material.

In an embodiment, referring again to FIG. 6B, the thickness of the coated with triblock copolymer layer 620 is approximately the same as, or slightly thicker than, the ultimate thickness of an ILD ultimately formed in its place. In an embodiment, as described in greater detail below, the polymer grid is formed not as an etch resist, but rather as scaffolding for ultimately growing a permanent ILD layer there around. As such, the thickness of the with triblock copolymer layer 620 can be important since it may be used to define the ultimate thickness of a subsequently formed permanent ILD layer. That is, in one embodiment, the polymer grating shown in FIG. 6B is eventually replaced with an ILD/metal line grating of roughly the same thickness.

It is to be appreciated that the two components of a triblock copolymer structure that are formed above metal lines need not have a 1:1 ratio (a 1:1 ratio was shown in FIGS. 5C and 6B). For example, the third segregated block component may be present in a lesser amount than the second component and may have a columnar structure surrounded by the second segregated block component. FIGS. 7A-7D illustrate plan views and corresponding cross-sectional views representing various operations in a method using a multifunctional molecule brush layer followed by a triblock copolymer for forming self-aligning vias or contacts for back end of line (BEOL) interconnects, in accordance with an embodiment of the present disclosure.

Referring to FIG. 7A, a plan view and corresponding cross-sectional view taken along the d-d' axis shows the third component 626 in lesser amount than the second component 624. The third segregated block component 626 has a columnar structure surrounded by the second segregated block component 624.

Referring to FIG. 7B, a plan view shows lithography 750 selection of certain ones 6752 of the third segregated block component 726 is performed to ultimately provide via locations for an upper metallization structure.

It is to be appreciated that FIG. 7A effectively illustrates an unexposed photosensitive directed self-assembly (DSA) structure, while FIG. 7B illustrates an exposed photosensitive DSA structure. In contrast to FIG. 6B, FIGS. 7A and 7B demonstrate an example of a columnar structure which may formed when many block copolymer molecules align with their shorter blocks of one of polymer forming columnar structures surrounded by a phase having the longer blocks of another polymer. In accordance with an embodiment of the present disclosure, the photoactive properties of a DSA structure provides the ability to effectively "plug" or "cut" one type of DSA polymer region with, e.g., e-beam or EUV exposure.

Referring to FIG. 7C, a plan view shows exposed/chemically amplified regions 754 in the zones of exposure. By selectivity, the only active modification is of the material of exposed portions of the third segregated block component 626. It is to be appreciated that, although shown as already cleared in FIG. 7C, the select regions may not yet be cleared.

Referring to FIG. 7D, a plan view and corresponding cross-sectional view taken along the e-e' axis shows post lithographic development to provide cleared regions 754. The cleared regions 754 may ultimately be used for via formation.

The resulting patterned DSA structure of FIG. 7D (or FIG. 5C or 6B) described above in may ultimately be used as a scaffolding from which permanent layers are ultimately formed. That is, it may be the case that none of the DSA materials exist in a final structure, but rather are used to direct fabrication of a finalized interconnect structure. In one such embodiment, a permanent ILD replaces one or more regions of the DSA material and subsequent processing (such as metal line fabrication) is completed. That is, it is possible that all DSA components ultimately removed for final self-aligned via and plug formation.

With reference again to FIGS. 5A-5C, 6A-6B, and 7A-7D, in an embodiment, subsequent to irradiating and developing select locations of the third segregated block component to provide the via openings, the resulting patterned triblock copolymer layer is used as a scaffolding to form a second level of alternating metal lines and dielectric lines above, coupled to, and orthogonal with the underlying level of alternating metal lines and dielectric lines. In one embodiment, one or more components of the triblock copolymer layer are retained in the final structure. For example, a final structure may include first, second and third segments of a triblock co-polymer. In one embodiment, one or more of the first, second and third segments of the triblock co-polymer remain on a brush layer, such as a brush layer formed from multifunctional molecules. In one embodiment, a region of one of the first, second and third segments of the triblock co-polymer is replaced with a conductive via structure.

However, in other embodiments, all components of the triblock copolymer layer are ultimately sacrificial in the sense that none of the material is retained in the final product. An exemplary embodiment of an implementation of the latter embodiment is described below in association with FIG. 8. Provided merely as an example of a final structure that may ultimately be obtained, FIG. 8 illustrates a plan view and corresponding cross-sectional views of a self-aligned via structure following metal line, via and plug formation, in accordance with an embodiment of the present disclosure.

Figure 8:
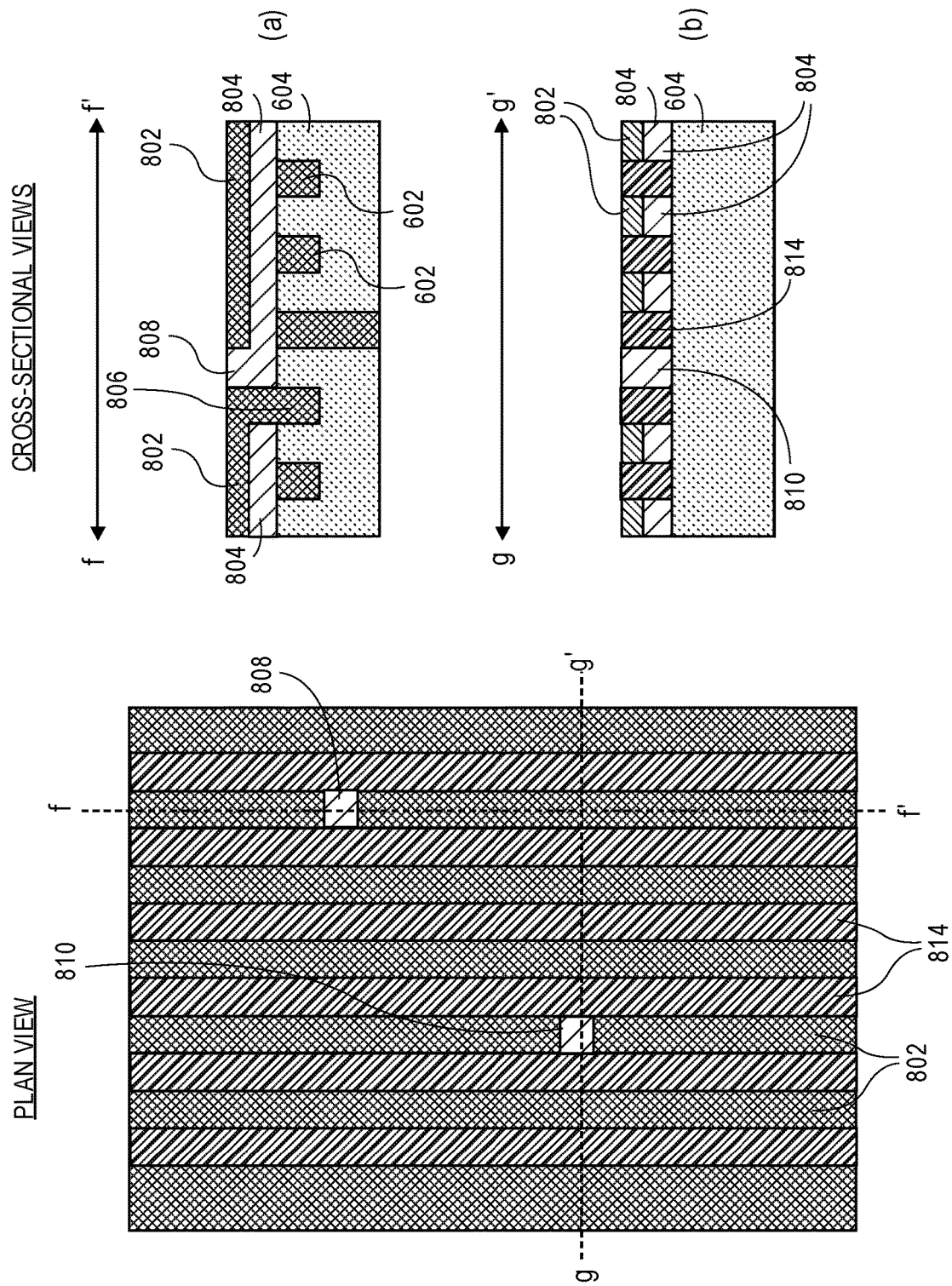
FIG. 8 illustrates a plan view and corresponding cross-sectional views of a self-aligned via structure following metal line, via and plug formation, in accordance with an embodiment of the present disclosure.

Referring to the plan view and corresponding cross-sectional views (a) and (b) taken along axes, f-f' and g-g', respectively, of FIG. 8, an upper level of metal lines 802 is provided in a dielectric framework (e.g., on dielectric layer 804 and adjacent to dielectric lines 814. The metal lines 802 are coupled with underlying metal lines 802 through the predetermined via locations (an example 806 of which is shown in cross-sectional view (a)), and are isolated by plugs (examples of which include plugs 808 and 810). The underlying lines 602 and 604 may be as described above in association with FIG. 6A, as formed in a direction orthogonal to the metal lines 802. It is to be appreciated that, in subsequent fabrication operations, the dielectric lines 814 may be removed to provide air gaps between the resulting metal lines 802.

A resulting structure such as that described in association with FIG. 8 may subsequently be used as a foundation for forming subsequent metal line/via and ILD layers. Alternatively, the structure of FIG. 8 may represent the final metal interconnect layer in an integrated circuit. It is to be appreciated that the above process operations may be practiced in alternative sequences, not every operation need be performed and/or additional process operations may be performed. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. As such, in an embodiment, offset due to conventional lithograph/dual damascene patterning that must otherwise be tolerated, is not a factor for the resulting structures described herein. It is to be appreciated that the above examples have focused on via/contact formation. However, in other embodiments, similar approaches may be used to preserve or form regions for line end termination (plugs) within a metal line layer.

In another aspect, one or more embodiments described herein are directed to selective hardmask approaches for conductive via fabrication, or other conductive structure fabrication. Selective hardmask fabrication may be achieved by directed self-assembly (DSA) or selective growth. Such selective hardmasks may be implemented in a processing scheme to enable the fabrication of self-aligned interconnects. Embodiments may address or implement one or more of the use of a differentiated molecular domain, a differentiated or "colored" hardmask, directed self-assembly, selective deposition, self-alignment, or patterning interconnects at tight pitch. Embodiments may be implemented to provide improved via shorting margin by self-alignment with "coloring" through selective deposition, and subsequent directed self-assembly, e.g., for the 10 nm and smaller technology nodes. In one embodiment, differentiated molecular domains are implemented for pattern-replication-based via self-alignment.

Selective surface modification may be performed and a brush layer may be transformed to a hardmask layer to provide a selective hardmask. As an example, FIGS. 9A-9D illustrate cross-sectional views of portions of integrated circuit layers representing various operations in a method involving selective hardmask formation using multifunctional molecules, in accordance with an embodiment of the present disclosure.

Figure 9A:
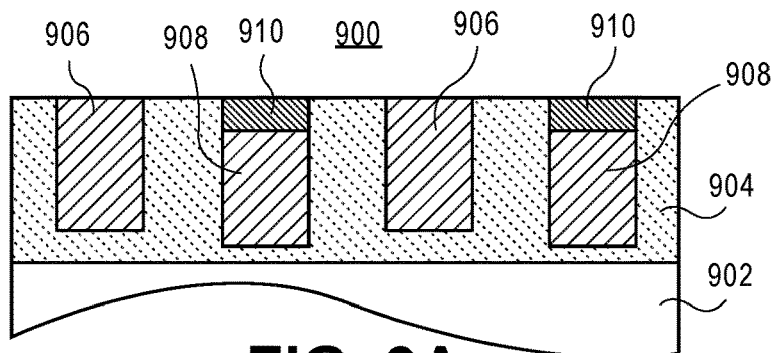
FIGS. 9A-9D illustrate cross-sectional views of portions of integrated circuit layers representing various operations in a method involving selective hardmask formation using a multifunctional molecule, in accordance with an embodiment of the present disclosure.

Referring to FIG. 9A, a starting structure 900 includes a plurality of alternating conductive features 906 and 908, such as alternating conductive lines, formed in an inter-layer-dielectric (ILD) layer formed above a substrate 902. The conductive features 906 of the plurality of alternating conductive features 906 and 908 have an exposed surface of a conductive material, such as a conductive fill material or a conductive cap. The conductive features 908 of the plurality of alternating conductive features 906 and 908 have a capping layer 910, such as a dielectric capping layer. In one embodiment, the surface chemistry of the capping layer 910 is more similar, or the same as, the ILD layer 904 versus the surface chemistry of the exposed surface of the conductive material of the conductive features 906 of the plurality of the alternating conductive features 906 and 908. In an embodiment, the plurality of alternating conductive features 906 and 908 is a single pitch grating. In another embodiment, the plurality of alternating conductive features 906 and 908 is a multi-pitch grating.

Figure 9B:
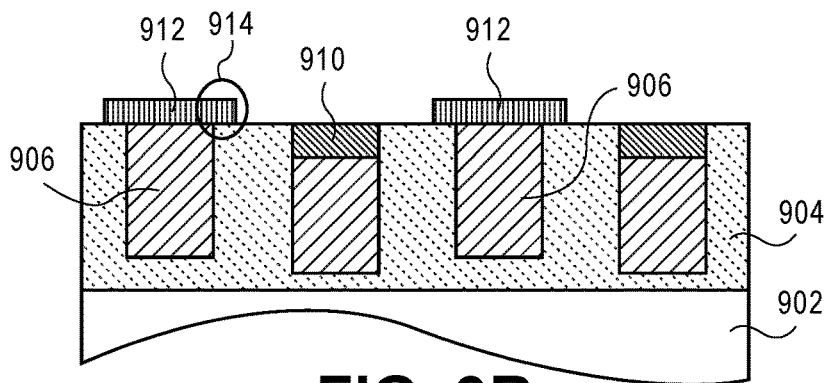

Referring to FIG. 9B, a first brush layer 912 is formed on the surface of the starting structure 900 of FIG. 9A. In an embodiment, the first brush layer 912 is selectively grafted over the exposed (metal-containing) surface of the conductive material of the conductive features 906 of the plurality of the alternating conductive features 906 and 908, as is depicted. In one embodiment, the first brush layer 912 is a multifunctional molecule such as described above in association with FIGS. 2, 3, 4A and 4B. In an embodiment, layer 912 of FIG. 9B is formed by a chemical brush process. In another embodiment, layer 912 of FIG. 9B is formed by a directed self-assembly (DSA) or a selective growth process, in place of or in combination with a chemical brush process.

It is to be appreciated that although the brush layer 912 can be applied selective to the exposed surface of the conductive material of the conductive features 906, the alignment may not be perfect, and extension portions 914 of the first brush layer 912 may be formed over portions of the ILD layer 904, as is depicted in the embodiment shown in FIG. 9B. In an embodiment alternative to that depicted in FIG. 9B, a first brush layer is selectively grafted over the capping layer 910 of the conductive features 908 of the plurality of the alternating conductive features 906 and 908 and, possibly, over the surfaces of the ILD layer 904, leaving the surfaces of the conductive material of the conductive features 906 as exposed. In an embodiment, once the brush layer 912 is implemented, over a specific location (e.g., either metal or ILD surface locations), brush layer 912 is used as a scaffold for a hardmask precursor.

Figure 9C:
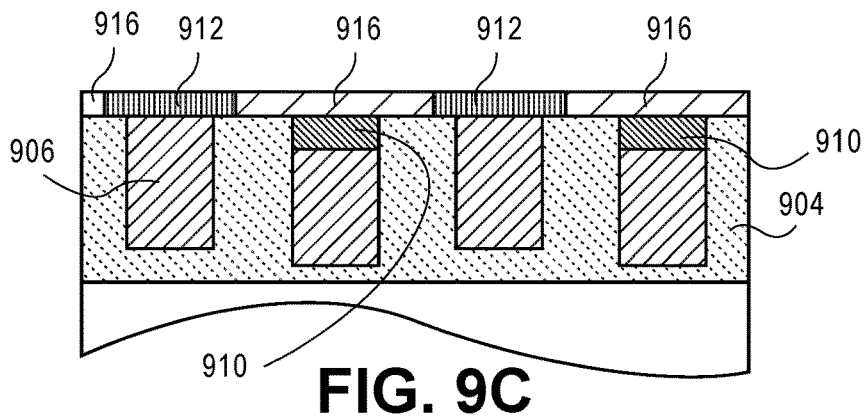

Referring to FIG. 9C, optionally, a second brush layer 916 is formed on the surface of the structure of FIG. 9B. In an embodiment, the second brush layer 912 is selectively grafted over the exposed capping layer 910 of the conductive features 908 of the plurality of the alternating conductive features 906 and 908, and over the surfaces of the ILD layer 904. In one embodiment, the second brush layer has only a single functionality.

Figure 9D:
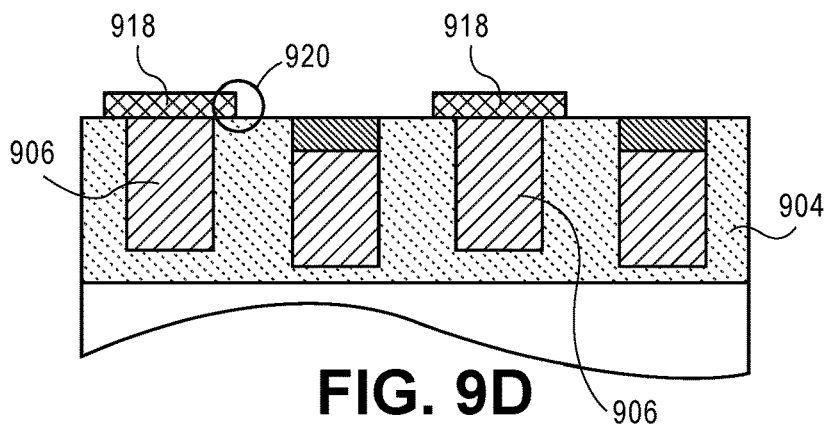

Referring to FIG. 9D, the first brush layer 912 is converted to a hardmask layer 918. In an embodiment, the hardmask layer 918 has an etch characteristic different from etch characteristics of ILD layer 904 and capping layer 910. As described below in association with FIGS. 11A-11F, such a differential etch characteristic may be exploited to fabricate a self-aligned conductive via structure. It is to be appreciated that in the case that the brush layer 912 is applied without perfect alignment, extension portions 920 of the hardmask layer 918 may be formed over portions of the ILD layer 904, as is depicted in the embodiment shown in FIG. 9D.

Referring again to FIG. 9D, in the case that a second brush layer 916 was formed as described in association with FIG. 9C, in an embodiment, such a brush layer 916 is removed subsequent to converting the first brush layer 912 to the hardmask layer 918.

A process may be implemented to effect metal selective surface modification and formation of a brush layer, precursor infiltration, ashing of the brush layer, and ultimate fabrication of hardmask. As an example, FIGS. 10A-10C illustrate cross-sectional views of portions of a conductive feature representing various operations in a method involving selective hardmask formation using multifunctional molecules, in accordance with an embodiment of the present disclosure.

Figure 10A:
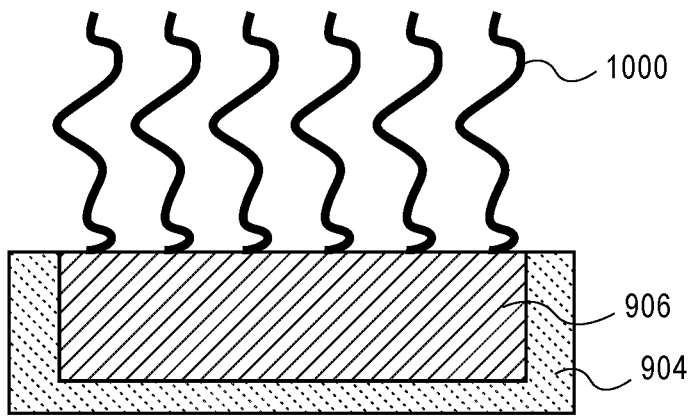
FIGS. 10A-10C illustrate cross-sectional views of portions of a conductive feature representing various operations in a method involving selective hardmask formation using a multifunctional molecule, in accordance with an embodiment of the present disclosure.

Referring to FIG. 10A, a conductive structure 906 is provided in an ILD layer 904, which may be formed above a substrate, as was described in association with FIG. 9A. A molecular layer 1000, such as layer 912 (which may be a brush layer) described above in association with FIG. 9, is formed on the surface of the conductive structure 906.

In an embodiment, the molecular layer is formed on the surface of the conductive structure 906 by selective grafting, DSA (such as spin-on DSA), or selective growth. In one embodiment, the molecular layer 1000 is porous or has low density in the sense that pores or spacings are formed throughout the molecular layer 1000. In a specific embodiment, the pores or spacing account for, e.g., 40-60% of the volume of the molecular layer 1000. In another specific embodiment, the pores or spacing account for, e.g., greater than 50% of the volume of the molecular layer 1000.

Figure 10B:
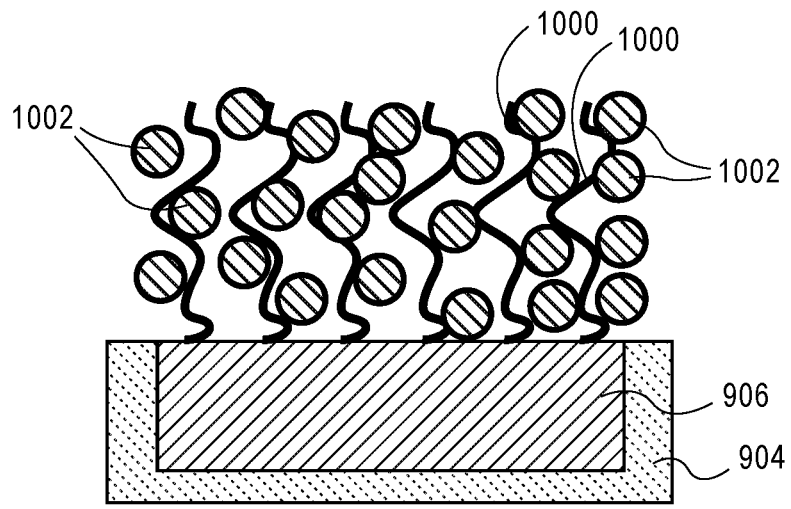
Figure 10C:
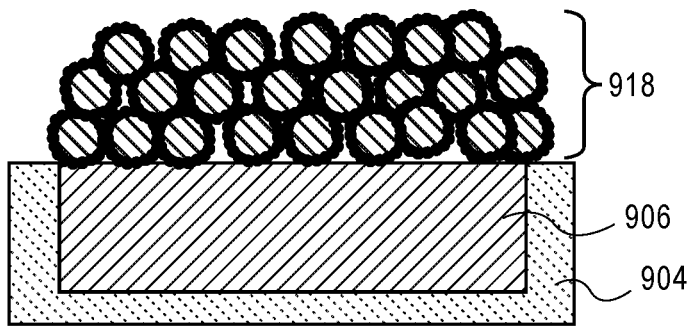

Referring to FIG. 10B, the pores or spacings of the molecular layer 1000 are filled with hardmask precursors 1002. In an embodiment, the process of filling the pores or spacings of the molecular layer 1000 with hardmask precursors 1002 is referred to as precursor infiltration of molecular layer 1000. In one embodiment, molecules of the hardmask precursors 1002 are delivered to the molecular layer 1000 in the vapor phase. In another embodiment, molecules of the hardmask precursors 1002 are delivered to the molecular layer 1000 in the liquid phase.

In a particular embodiment, the pores or spacings of the molecular layer 1000 are filled with hardmask precursors 1002 using an atomic layer deposition (ALD) process. In one such embodiment, a slow and penetrating ALD process is used to fill the pores or spacings of the molecular layer 1000. In other embodiments, the pores or spacings of the molecular layer 1000 are filled with hardmask precursors 1002 filled using a spin-on process. In either case, in an embodiment, by using the above described two-operation process of brush or DSA or selective growth of molecular layer 1000 followed by pore or spacing filling, chemical stability of the resulting filled material may be achieved.

In an embodiment, the pores or spacings of the molecular layer 1000 are filled with a metal-containing material. In one such embodiment, the metal-containing material is a metal nitride or a precursor to a metal nitride such as, but not limited to, titanium nitride (TiN), vanadium nitride (VN) or tantalum nitride (TaN). In another such embodiment, the metal-containing material is a metal oxide or a precursor to a metal oxide such as, but not limited to, scandium oxide ($Sc_2O_3$), yttrium oxide ($Y_2O_3$), tantalum oxide ($Ta_2O_5$), titanium oxide ($TiO_2$), zirconium oxide ($ZrO_2$), aluminum oxide ($Al_2O_3$), or hafnium oxide ($HfO_2$). In other embodiments, a non-metal-containing material or a precursor to a non-metal-containing material, such as boron carbide, boron nitride, silicon nitride, silicon oxide, silicon dioxide or silicon carbide, is used to fill the pores or spacings of the molecular layer 1000.

Referring to FIG. 10C, the structure of FIG. 10B including the molecular layer 1000 having pores or spacings filled with hardmask precursors 1002 is converted to a hardmask layer 918, such as hardmask layer 918 described in association with FIG. 9D. In an embodiment, the hardmask layer 918 has an etch characteristic different from etch characteristics of ILD layer 9104. In an embodiment, the hardmask layer 918 has a stability suitable to protect the conductive feature 9106 during a subsequent etch process. As described below in association with FIGS. 11A-11F, such a differential etch characteristic or material stability characteristic may be exploited to fabricate a self-aligned conductive via structure.

In an embodiment, the molecular layer 1000 having pores or spacings filled with hardmask precursors 1002 is converted to the hardmask layer 918 using an ash process. In one embodiment, the ash process removes all or substantially all of the polymer and/or carbon-based material of molecular layer 1020 to essentially remove most, if not all, of the material of molecular layer 1000. In a specific embodiment, the ashing and, hence, removal of the molecular layer 1000 permits the hardmask precursors 1002 to be converted to the material of hardmask layer 918. In another specific embodiment, the ashing and, hence, removal of the molecular layer 1000 permits the hardmask precursors 1002 to coagulate, forming hardmask layer 918.

In an embodiment, the ash process is a plasma ash process. In an embodiment, the operations of FIGS. 10A, 10B and 10C are performed once and in sequence to form hardmask 918. In another embodiment, the operations of FIGS. 10A, 10B and 10C are cyclically repeated to form hardmask 918 to a selected thickness. In another embodiment, the operations of FIGS. 10B and 10C are cyclically repeated to form hardmask 918 to a selected thickness.

In an exemplary approach for forming a conductive via, FIGS. 11A-11F illustrate cross-sectional views of portions of integrated circuit layers representing various operations in a method involving selective hardmask using multifunctional molecules, followed by self-aligned conductive via formation for back end of line (BEOL) interconnect fabrication, in accordance with an embodiment of the present disclosure.

Figure 11A:
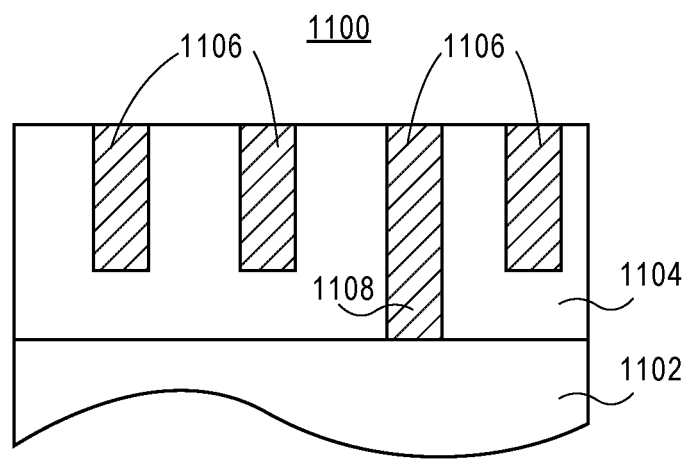
FIGS. 11A-11F illustrate cross-sectional views of portions of integrated circuit layers representing various operations in a method involving selective hardmask using a multifunctional molecule, followed by self-aligned conductive via formation for back end of line (BEOL) interconnect fabrication, in accordance with an embodiment of the present disclosure.

Referring to FIG. 11A, a starting structure 1100 is provided as a beginning point for fabricating a new metallization layer. The starting structure 1100 includes an inter-layer dielectric (ILD) layer 1104 above a substrate 1102. As described below, the ILD layer 1104 may be above an underlying metallization layer formed above the substrate 102. Trenches are formed in the ILD layer 1104 and are filled with a conductive layer or layers to provide conductive lines 1106 (and, in some cases, corresponding conductive vias 1108). In an embodiment, the trenches of conductive lines 1106 are formed in the ILD layer 1104 using a pitch division patterning process flow. It is to be appreciated that the following process operation described below may first involve pitch division, or may not. In either case, but particularly when pitch division is also used, embodiments may enable continued scaling of the pitch of metal layers beyond the resolution capability of state-of-the art lithography equipment. In an embodiment, the plurality of conductive lines 1106 is a single pitch grating. In another embodiment, the plurality of conductive lines 1106 is a multi-pitch grating.

In an embodiment, the conductive lines 1106 are all fabricated at the same time and are fabricated from the same material or materials. In another embodiment, however, the starting structure 1100 is fabricated by patterning a hardmask and ILD layer and then metallizing half of a population of metal trenches (e.g., alternating one of the trenches), leaving the other half of the population open until a subsequent metallization process is performed on the other half of the population. Such an approach allows for the possibility of differing composition of alternating lines. For example, in one embodiment, a metallization layer ultimately includes conductive interconnects of alternating, differing first and second compositions.

Figure 11B:
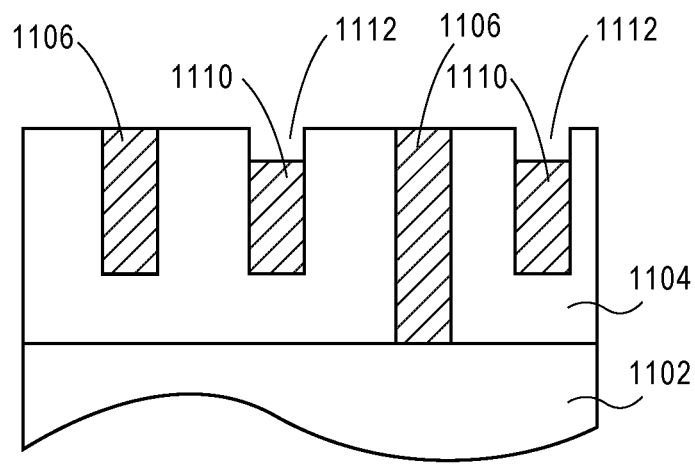

Referring to FIG. 11B, alternative ones of the plurality of conductive lines 1106 are recessed below the upper surface of the ILD layer 1104 to provide recessed conductive lines 1110 having recess regions 1112 above the recessed conductive lines 1110. In an embodiment, then, at this stage, remaining ones of non-recessed conductive lines 1106 alternate with recessed conductive lines 1110. In an embodiment, alternating ones of the conductive lines 1106 are recessed to form the recessed conductive lines 1110 using a selective wet etch process, such as a wet etch process based on sulfuric acid and hydrogen peroxide. In another embodiment, alternating ones of the conductive lines 1106 are recessed to form recessed conductive lines 1110 using a selective dry or plasma etch process.

In an embodiment, the non-recessed conductive lines 1106 and the recessed conductive lines 1110 have a same total composition, and the recessed conductive lines 1110 are formed by masking regions where the non-recessed conductive lines 1106 are to remain and etching the unmasked regions to form the recessed conductive lines 1110. In another embodiment, the non-recessed conductive lines 1106 and the recessed conductive lines 1110 have a different total composition, and the recessed conductive lines 1110 are formed by masking regions where the non-recessed conductive lines 1106 are to remain and etching the unmasked regions to form the recessed conductive lines 1110. In another embodiment, the non-recessed conductive lines 1106 and the recessed conductive lines 1110 have a different total composition, and the recessed conductive lines 1110 are formed by using an etch that only etches the material of the recessed conductive lines 1110.

Figure 11C:
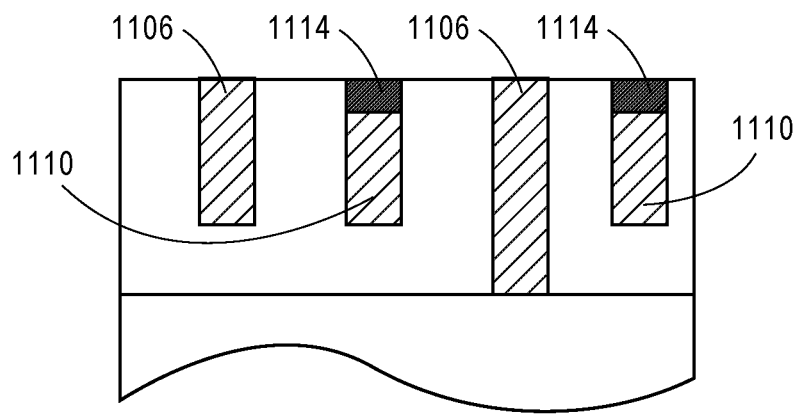

Referring to FIG. 11C, a capping layer 1114 is formed in the recess regions 1112 above the recessed conductive lines 1110. In an embodiment, the capping layer 1114 is composed of a material that has more similar surface characteristics compared with the surface of ILD layer 1104 than does the material of the conductive lines 1106. In an embodiment, the conductive lines 1106 include a copper fill material within a titanium nitride or tantalum nitride barrier liner, and the capping layer 1114 is composed of a dielectric material such as a silicon oxide, silicon nitride, a silicon carbide material, or a non-conductive metal oxide layer such as a high-k dielectric layer. In an embodiment, the capping layer 1114 is formed using a chemical vapor deposition (CVD) process or an atomic layer deposition (ALD) process, or a spin-on process. In any case, in an embodiment, following deposition, the material of the capping layer 1114 is planarized, e.g., using chemical mechanical polishing (CMP), resulting in capping layer 1114 that is substantially co-planar with an uppermost surface of the ILD layer 1104, as is depicted in FIG. 11C. In an embodiment, the capping layer 1114 includes a material such as, but not limited to, silicon oxide, carbon-doped silicon, silicon nitride, or silicon oxynitride.

It is to be appreciated that, aside from protecting the metal of recessed conductive lines 1110 in subsequent processing steps, the material of capping layer 1114 may also aid the selective deposition of brush materials, such as in the processes described above in association with FIGS. 9A-9D and 10A-10C. In an embodiment, capping layer 1114 provides hermeticity during processing and reliability benefits in lieu of a conventional etch stop layer, in addition to facilitating pattern replication.

Figure 11D:
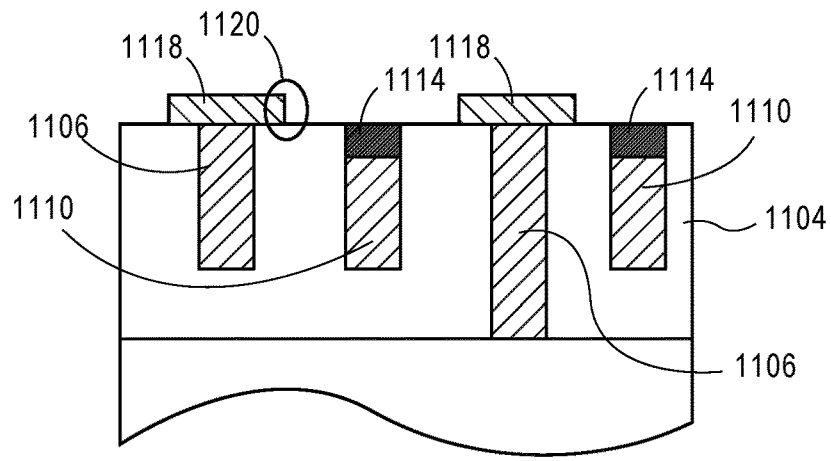

Referring to FIG. 11D, a hardmask layer 1118 is formed over the structure of FIG. 11C. The hardmask layer 1118 is, in an embodiment, formed on and in alignment with the first conductive lines 1106. In a particular embodiment, however, the alignment is not perfect, and extension portions 1120 are included in hardmask layer 1118. The extension portions 1118 cover a portion of surface of the ILD layer 1104. In an embodiment, the hardmask layer 1116 is formed using an approach and is composed of a material as described above in embodiments regarding hardmask layer 918.

In an embodiment, the hardmask layer 1118 has an etch characteristic different from the etch characteristics of the ILD layer 1104 and of the capping layer 1114. In a particular embodiment, the hardmask layer 1118 is composed of alumina, and the capping dielectric is selected from the group consisting of silicon oxide, carbon-doped silicon, silicon nitride, and silicon oxynitride.

As described in greater detail below, in an embodiment, the resulting structure of FIG. 11D enables improved via shorting margins when fabricating later via layers on the structure of FIG. 11D. In one embodiment, improved shorting margin is achieved since fabricating a structure with a selective hardmask reduces the risk of a via shorting to a wrong metal line. In one embodiment, self-alignment is achieved since the selective hardmask is self-aligned to the conducive lines 1106.

Figure 11E:
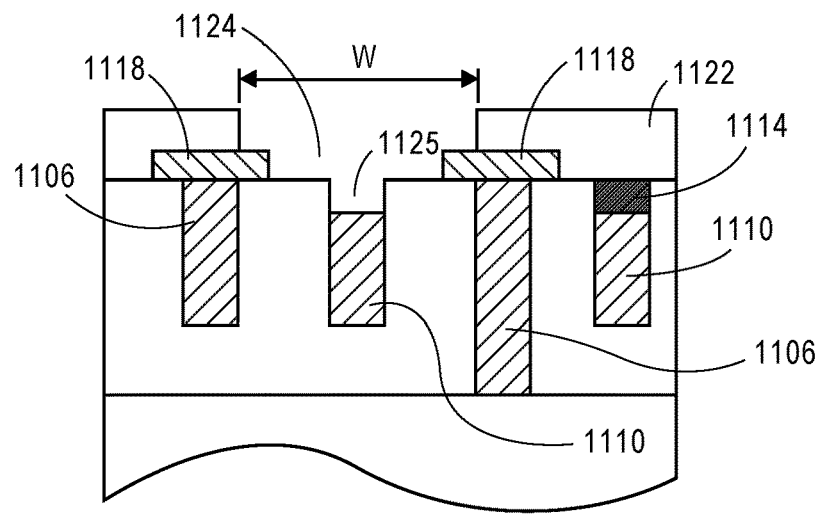

Referring to FIG. 11E, a second inter-layer dielectric (ILD) layer 1122 is formed above the structure of FIG. 11D. An opening 1124 is formed in the second ILD layer 1122. In an embodiment, the opening 1124 is formed in a location selected for conductive via fabrication for a next level metallization layer. In contrast to conventional via location selection, the opening 1124 can, in one embodiment, have a relatively relaxed width (W) as compared to the width of the corresponding conductive line (such as a selected conductive line 1110) onto which the conductive via will ultimately be formed. Such an accommodation for a relatively wider via opening 1124 can relax constraints on the lithography process used to form the opening 1124. Additionally, tolerance for mis-alignment may be increased as well.

In an embodiment, the capping layer 1114 on the selected recessed conductive line 1110 is removed in order to form an opening 1125 exposing a conductive surface of the recessed conductive line 1110. In one such embodiment, even in the case that portions of the hardmask layer 1118 are exposed by the opening 1124, etch characteristics of the capping layer 1114 are different enough from the etch characteristics of the hardmask 1118 such that hardmask 1118 does not erode or only negligibly erodes during formation of the opening 1124 and/or removal of the capping layer 1114 from the selected recessed line 1110 to form opening 1125. In a particular embodiment, hardmask layer 1118 protects conductive lines 1106 and/or inhibits exposure of conductive lines 1106 during the formation of the opening 1124 and/or removal of the capping layer 1114 from the selected recessed line 1110 to form opening 1125. In an embodiment, removal of the capping layer 1114 from the selected recessed line 1110 to form opening 1125 is performed using a selective wet etch process. In another embodiment, removal of the capping layer 1114 from the selected recessed line 1110 to form opening 1125 is performed using a selective dry or plasma etch process.

Figure 11F:
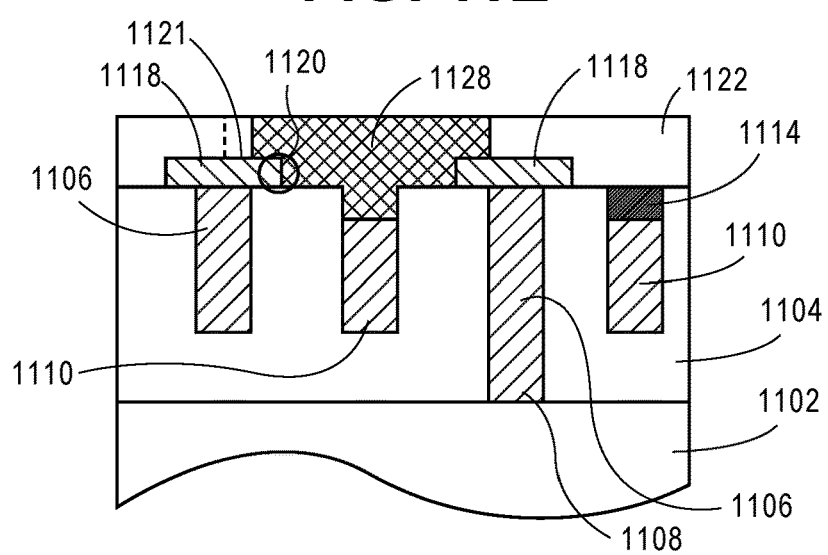

FIG. 11F illustrates the structure of FIG. 11E following next layer via fabrication. A conductive via 1128 is formed in the opening 1124 and in the opening 1125, such that conductive via 1128 is electrically connected to the selected recessed conductive line 1110. In an embodiment, the conductive via 1128 electrically contacts the selected recessed conductive line 1110 without shorting to one of the adjacent or neighboring conductive lines 1106. In a specific embodiment, a portion of the conductive via 1128 is on one or more exposed portions of the hardmask layer 1118, as is depicted in FIG. 11F. In one such embodiment, the hardmask layer 1118 inhibits electrical connection of conductive via 1128 to adjacent or neighboring conductive lines 1106. In an embodiment, then, an improved shorting margin is realized.

Referring again to FIG. 11F, in an illustrative embodiment, an integrated circuit structure includes a plurality of conductive lines 1106/1110 in an inter-layer dielectric (ILD) layer 1104 above a substrate 1102. The plurality of conductive lines 1106/1110 includes alternating non-recessed conductive lines 1106 and recessed conductive lines 1110. The non-recessed conductive lines 1106 are substantially co-planar with the ILD layer 1104, and the recessed conductive lines 1110 are recessed relative to an uppermost surface of the ILD layer 1104. A dielectric capping layer 1114 is in recess regions above the recessed conductive lines 1110. A hardmask layer 1118 is over the non-recessed conductive lines 1106 but not over the dielectric capping layer 1114 of the recessed conductive lines 1110. The hardmask layer 1118 differs in composition from the dielectric capping layer 1114. A conductive via 1128 is in an opening (1125) in the dielectric capping layer 1114 and on one of the recessed conductive lines 1110. A portion of the conductive via 1128 is on a portion of the hardmask layer 1118.

In an embodiment, the conductive via 1128 is over a portion 1121 of the hardmask layer 1118 over one of the non-recessed conductive lines 1106 adjacent to the one of the recessed conductive lines 1110, as is depicted in FIG. 11F, where the dashed line represents an extension of the conductive via 1128 over the portion 1121 of the hardmask layer 1118. In an embodiment, the hardmask layer 1118 includes an extension portion 1120 over a portion of the ILD layer 304 between one of the non-recessed conductive lines 1106 and the one of the recessed conductive lines 1110, as is depicted in FIG. 11F. In one such embodiment, the conductive via 1128 is over the extension portion 1120 of the hardmask layer 1118 over the portion of the ILD layer 1104, as is depicted in FIG. 11F. In a particular such embodiment, the conductive via 1128 is further over a portion 1121 of the hardmask layer 1118 over the one of the non-recessed conductive lines 1106, as is depicted in FIG. 11F, where the dashed line represents an extension of the conductive via 1128 over the portion 1121 of the hardmask layer 1118.

In an embodiment, the dielectric capping 1114 layer has an uppermost surface substantially co-planar with the uppermost surface of the ILD layer 1104, as is depicted in FIG. 11F. In an embodiment, a second ILD layer 1122 is included above the hardmask layer, and the conductive via 1128 is further in an opening of the second ILD layer 1122, as is depicted in FIG. 11F. In one such embodiment, the opening (1124) of the second ILD layer 1122 has a width greater than a width of the opening (1125) in the dielectric capping layer 1114, as is depicted in FIG. 11F. In an embodiment, one of the plurality of conductive lines 1106/1110 is coupled to an underlying conductive via structure 1108, as is depicted in FIG. 11F. In one such embodiment, the underlying conductive via 1108 structure is connected to an underlying metallization layer (not shown) of the integrated circuit structure.

In an embodiment, the hardmask layer 1118 includes aluminum oxide, and the dielectric capping layer 1114 includes a material selected from the group consisting of boron carbide, boron nitride, silicon oxide, carbon-doped silicon, silicon nitride and silicon oxynitride. In an embodiment, a total composition of the non-recessed conductive lines 1106 is different than a total composition of the recessed conductive lines 1110. In another embodiment, a total composition of the non-recessed conductive lines 1106 is the same as a total composition of the recessed conductive lines 1110.

A resulting structure such as described in association with FIG. 11F may subsequently be used as a foundation for forming subsequent metal line/via and ILD layers. Alternatively, the structure of FIG. 11F may represent the final metal interconnect layer in an integrated circuit. It is to be appreciated that the above process operations may be practiced in alternative sequences, not every operation need be performed and/or additional process operations may be performed.

Figure 12:
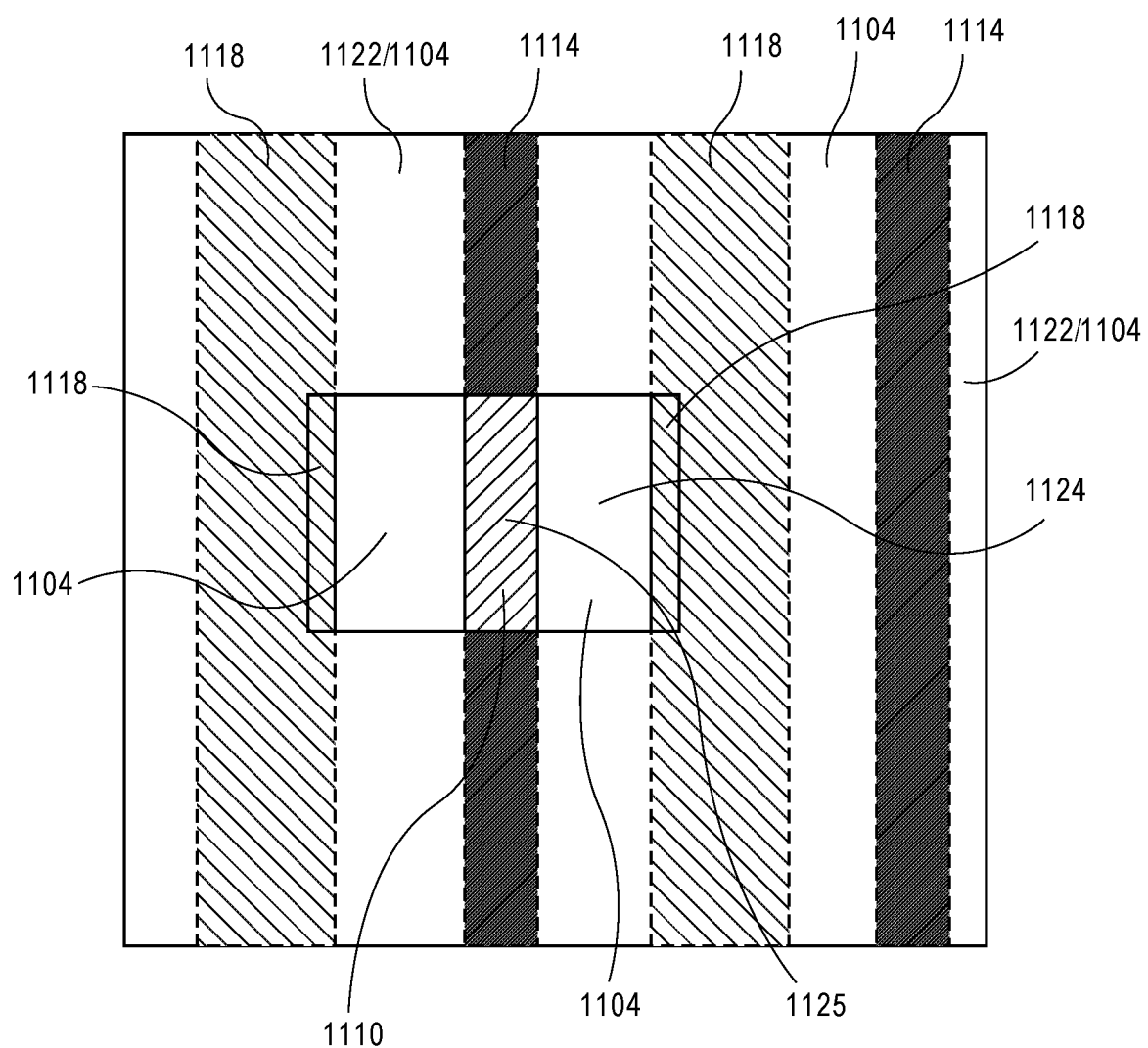
FIG. 12 illustrates a plan view of a portion of an integrated circuit layer representing an operation in a method involving selective hardmask using a multifunctional molecule, followed by self-aligned conductive via formation for back end of line (BEOL) interconnect fabrication, in accordance with an embodiment of the present disclosure.

FIG. 12 illustrates a plan view of a portion of an integrated circuit layer representing an operation in a method involving selective hardmask using multifunctional molecules, followed by self-aligned conductive via formation for back end of line (BEOL) interconnect fabrication, in accordance with an embodiment of the present disclosure.

Referring to FIG. 12, features below and covered by the second ILD layer 1122 are shown as features with dashed perimeters. Features exposed by opening 1124, from a plan perspective, are shown with solid perimeters. In FIG. 12, according to one embodiment, locations of the hardmask layer 1118, the dielectric capping layer 1114, the opening 1124, the opening 1125, and surfaces of the ILD layer 1104 are depicted. As seen in this view, in accordance with one embodiment, the opening 1124 and, hence, the opening 1125, does not reveal the entire underlying recessed line 1110, but rather only a portion of the line 1110 where via formation is to occur. It is further to be appreciated that FIG. 12 is representative of an embodiment where the plurality of conductive lines 1106/1110 (e.g., from FIGS. 11A-11F) is formed along a same direction of a back end of line (BEOL) metallization layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 13:
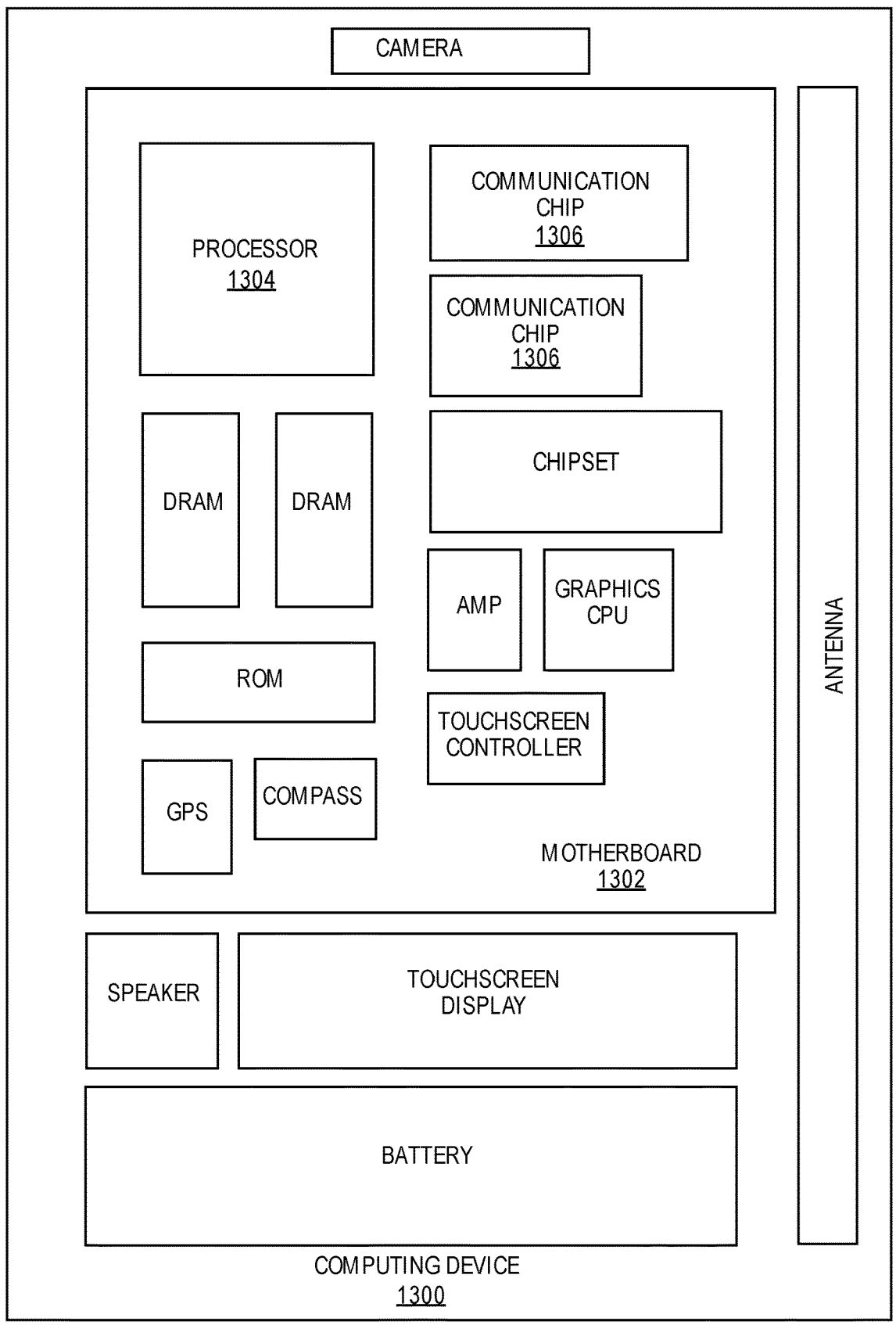
FIG. 13 illustrates a computing device in accordance with one implementation of an embodiment of the present disclosure.

FIG. 13 illustrates a computing device 1300 in accordance with one implementation of the disclosure. The computing device 1300 houses a board 1302. The board 1302 may include a number of components, including but not limited to a processor 1304 and at least one communication chip 1306. The processor 1304 is physically and electrically coupled to the board 1302. In some implementations the at least one communication chip 1306 is also physically and electrically coupled to the board 1302. In further implementations, the communication chip 1306 is part of the processor 1304.

Depending on its applications, computing device 1300 may include other components that may or may not be physically and electrically coupled to the board 1302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1306 enables wireless communications for the transfer of data to and from the computing device 13800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1300 may include a plurality of communication chips 1306. For instance, a first communication chip 1306 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 1304 of the computing device 1300 includes an integrated circuit die packaged within the processor 1304. In some implementations of the disclosure, the integrated circuit die of the processor includes one or more structures including or fabricated using multifunctional molecules, built in accordance with implementations of embodiments of the disclosure. The term "processor" may refer to any device or portion of a device that processes electronic data from registers and/or memory to transform that electronic data into other electronic data that may be stored in registers and/or memory.

The communication chip 1306 also includes an integrated circuit die packaged within the communication chip 1306. In accordance with another implementation of the disclosure, the integrated circuit die of the communication chip includes one or more structures including or fabricated using multifunctional molecules, built in accordance with implementations of embodiments of the disclosure.

In further implementations, another component housed within the computing device 1300 may contain an integrated circuit die that includes one or more structures including or fabricated using multifunctional molecules, built in accordance with implementations of embodiments of the disclosure.

In various implementations, the computing device 1300 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 14:
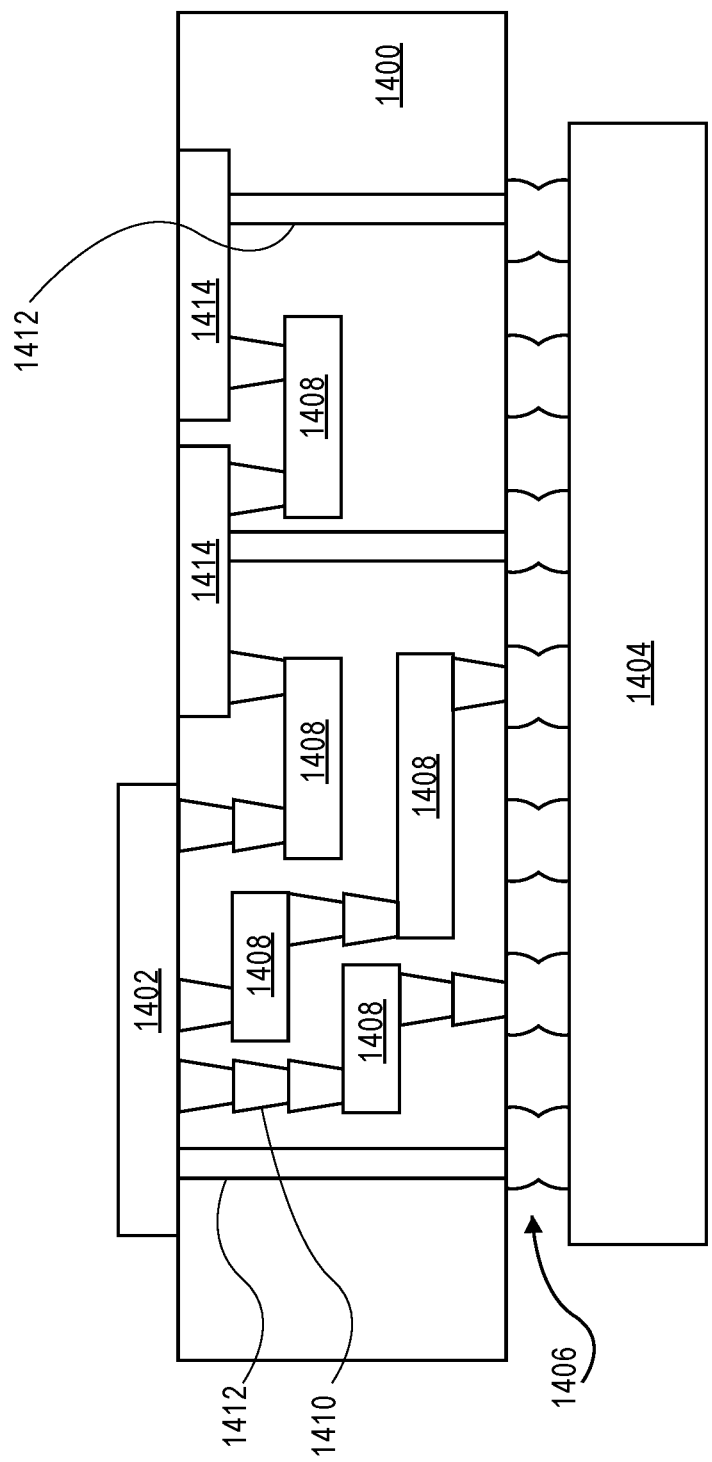
FIG. 14 is an interposer implementing one or more embodiments of the disclosure.

FIG. 14 illustrates an interposer 1400 that includes one or more embodiments of the disclosure. The interposer 1400 is an intervening substrate used to bridge a first substrate 1402 to a second substrate 1404. The first substrate 1402 may be, for instance, an integrated circuit die. The second substrate 1404 may be, for instance, a memory module, a computer motherboard, or another integrated circuit die. Generally, the purpose of an interposer 1400 is to spread a connection to a wider pitch or to reroute a connection to a different connection. For example, an interposer 1400 may couple an integrated circuit die to a ball grid array (BGA) 1406 that can subsequently be coupled to the second substrate 1404. In some embodiments, the first and second substrates 1402/1404 are attached to opposing sides of the interposer 1400. In other embodiments, the first and second substrates 1402/1404 are attached to the same side of the interposer 1400. And in further embodiments, three or more substrates are interconnected by way of the interposer 1400.

The interposer 1400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1408 and vias 1410, including but not limited to through-silicon vias (TSVs) 1412. The interposer 1400 may further include embedded devices 1414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1400. In accordance with embodiments of the disclosure, apparatuses or processes disclosed herein may be used in the fabrication of interposer 1400.

Thus, embodiments of the present disclosure include multifunctional molecules for selective polymer formation on conductive surfaces, and the resulting structures.

Example Embodiment 1

An integrated circuit structure includes a lower metallization layer including alternating metal lines and dielectric lines above the substrate. A molecular brush layer is on the metal lines of the lower metallization layer, the molecular brush layer including multifunctional molecules. A triblock copolymer layer is above the lower metallization layer. The triblock copolymer layer includes a first segregated block component over the dielectric lines of the lower metallization layer, and alternating second and third segregated block components on the molecular brush layer on the metal lines of the lower metallization layer, where the third segregated block component is photosensitive.

Example Embodiment 2

The integrated circuit structure of example embodiment 1, further including a conductive via in one location of the third segregated block component, the conductive via on one of the metal lines.

Example Embodiment 3

The integrated circuit structure of example embodiment 1 or 2, further including a second, different, molecular brush layer on the dielectric lines of the lower metallization layer, wherein the first segregated block component is on the second molecular brush layer.

Example Embodiment 4

The integrated circuit structure of example embodiment 3, wherein the second molecular brush layer includes a single functional polymeric material.

Example Embodiment 5

The integrated circuit structure of example embodiment 1, 2, 3 or 4, wherein the triblock copolymer layer includes a triblock copolymer species selected from the group consisting of any three of poly-styrene and other polyvinylarenes, polyisoprene and other polyolefins, poly-methacrylate and other poly-esters, polydimethylsiloxane (PDMS) and related Si-based polymers, polyferrocenylsilanes, polyethyelene oxide (PEO) and related poly-ethers and poly-vinylpyridine.

Example Embodiment 6

The integrated circuit structure of example embodiment 1, 2, 3, 4 or 5, wherein the alternating second and third segregated block components have a ratio of approximately 1:1.

Example Embodiment 7

The integrated circuit structure of example embodiment 1, 2, 3, 4 or 5, wherein the alternating second and third segregated block components have a ratio of X:1, second segregated block component to third segregated block component, wherein X is greater than 1, and wherein the third segregated block component has a columnar structure surrounded by the second segregated block component.

Example Embodiment 8

The integrated circuit structure of example embodiment 1, 2, 3, 4, 5, 6 or 7, wherein the alternating metal lines and dielectric lines of the lower metallization layer have a grating pattern with a constant pitch.

Example Embodiment 9

The integrated circuit structure of example embodiment 1, 2, 3, 4, 5, 6, 7 or 8, wherein the third segregated block component of the triblock copolymer layer is photosensitive to an extreme ultra-violet (EUV) source or an e-beam source.

Example Embodiment 10

A method of fabricating an integrated circuit structure includes forming a lower metallization layer including alternating metal lines and dielectric lines above a substrate. The method also includes forming a molecular brush layer on the metal lines of the lower metallization layer, the molecular brush layer including multifunctional molecules. The method also includes forming a triblock copolymer layer above the lower metallization layer. The method also includes segregating the triblock copolymer layer to form a first segregated block component over the dielectric lines of the lower metallization layer, and to form alternating second and third segregated block components on the molecular brush layer on the metal lines of the lower metallization layer, where the third segregated block component is photosensitive. The method also includes irradiating and developing select locations of the third segregated block component to provide via openings over the metal lines of the lower metallization layer.

Example Embodiment 11

The method of claim 10, further including, subsequent to irradiating and developing select locations of the third segregated block component to provide the via openings, using the resulting patterned triblock copolymer layer as a scaffolding to form a second level of alternating metal lines and dielectric lines above, coupled to, and orthogonal with the first level of alternating metal lines and dielectric lines.

Example Embodiment 12

The method of example embodiment 10 or 11, further including, prior to forming the triblock copolymer layer, forming a second molecular brush layer on the dielectric lines of the lower metallization layer.

Example Embodiment 13

The method of example embodiment 12, wherein the second molecular brush layer is formed using single functional polymeric material.

Example Embodiment 14

The method of example embodiment 10, 11, 12 or 13, wherein forming the triblock copolymer layer incudes providing a triblock copolymer species selected from the group consisting of any three of poly-styrene and other polyvinylarenes, polyisoprene and other polyolefins, poly-methacrylate and other poly-esters, polydimethylsiloxane (PDMS) and related Si-based polymers, polyferrocenylsilanes, polyethyelene oxide (PEO) and related poly-ethers and poly-vinylpyridine.

Example Embodiment 15

The method of example embodiment 10, 11, 12, 13 or 14, wherein forming the alternating metal lines and dielectric lines of the lower metallization layer includes forming a grating pattern having a constant pitch.

Example Embodiment 16

The method of example embodiment 10, 11, 12, 13, 14 or 15, wherein irradiating and developing the select locations of the third segregated block component includes exposing the select locations of the third segregated block component to an extreme ultra-violet (EUV) source or an e-beam source.

Example Embodiment 17

The method of example embodiment 10, 11, 12, 13, 14, 15 or 16, wherein the alternating second and third segregated block components have a ratio of approximately 1:1.

Example Embodiment 18

The method of example embodiment 10, 11, 12, 13, 14, 15 or 16, wherein the alternating second and third segregated block components have a ratio of X:1, second segregated block component to third segregated block component, wherein X is greater than 1, wherein the third segregated block component has a columnar structure surrounded by the second segregated block component.

Example Embodiment 19

A method of fabricating an integrated circuit structure includes forming a plurality of conductive lines in an inter-layer dielectric (ILD) layer above a substrate. The method also includes recessing alternating ones of the plurality of conductive lines relative to an uppermost surface of the ILD layer. The method also includes forming a dielectric capping layer on the alternating ones of the plurality of conductive lines, in recess regions above each of the alternating ones of the plurality of conductive lines. The method also includes forming a hardmask layer over non-recessed ones of the plurality of conductive lines but not over the dielectric capping layer, the hardmask layer differing in composition from the dielectric capping layer, and where forming the hardmask layer includes forming a brush layer including multifunctional molecules on the non-recessed ones of the plurality of conductive lines but not on the dielectric capping layer. The method also includes forming an opening in the dielectric capping layer over one of the alternating ones of the plurality of conductive lines. The method also includes forming a conductive via in the opening in the dielectric capping layer and on a portion of the hardmask layer over one of the non-recessed ones of the plurality of conductive lines.

Example Embodiment 20

The method of example embodiment 19, wherein forming the hardmask layer further includes filling pores or spacings of the brush layer with hardmask material or hardmask precursors, and removing substantially all of the brush layer, where the hardmask layer is formed from the hardmask material or hardmask precursors during or subsequent to removing substantially all of the brush layer.

Example Embodiment 21

The method of example embodiment 20, wherein removing substantially all of the brush layer includes ashing a molecular layer of the brush layer.

Example Embodiment 22

The method of example embodiment 19, 20 or 21, wherein the hardmask layer and the dielectric capping layer differ in etch selectivity.

Example Embodiment 23

The method of example embodiment 19, 20, 21 or 22, wherein forming the plurality of conductive lines includes using a pitch division patterning process.

What is claimed is:

1. An integrated circuit structure, comprising:
a lower metallization layer comprising alternating metal lines and dielectric lines above a substrate;
a first molecular brush layer on the metal lines of the lower metallization layer, the first molecular brush layer comprising multifunctional molecules;
a second molecular brush layer on the dielectric lines of the lower metallization layer, the second molecular brush layer separate and distinct from the first molecular brush layer; and
a triblock copolymer layer above the lower metallization layer and comprising:
a first segregated block component over the dielectric lines of the lower metallization layer; and
alternating second and third segregated block components on the first molecular brush layer on the metal lines of the lower metallization layer, wherein the third segregated block component is photosensitive.

2. The integrated circuit structure of claim 1, further comprising: a conductive via in one location of the third segregated block component, the conductive via on one of the metal lines.

3. The integrated circuit structure of claim 1,
wherein the first segregated block component is on the second molecular brush layer.

4. The integrated circuit structure of claim 3, wherein the second molecular brush layer comprises a single functional polymeric material.

5. The integrated circuit structure of claim 1, wherein the triblock copolymer layer comprises a triblock copolymer species selected from the group consisting of any three of poly-styrene and other polyvinylarenes, polyisoprene and other polyolefins, poly-methacrylate and other poly-esters, polydimethylsiloxane (PDMS) and related Si-based polymers, polyferrocenylsilanes, polyethyelene oxide (PEO) and related poly-ethers and poly-vinylpyridine.

6. The integrated circuit structure of claim 1, wherein the alternating second and third segregated block components have a ratio of approximately 1:1.

7. The integrated circuit structure of claim 1, wherein the alternating second and third segregated block components have a ratio of X:1, second segregated block component to third segregated block component, wherein X is greater than 1, and wherein the third segregated block component has a columnar structure surrounded by the second segregated block component.

8. The integrated circuit structure of claim 1, wherein the alternating metal lines and dielectric lines of the lower metallization layer have a grating pattern with a constant pitch.

9. The integrated circuit structure of claim 1, wherein the third segregated block component of the triblock copolymer layer is photosensitive to an extreme ultra-violet (EUV) source or an e-beam source.

\* \* \* \* \*